(12) United States Patent
Seyama

(10) Patent No.: US 10,910,248 B2
(45) Date of Patent: Feb. 2, 2021

(54) ELECTRONIC COMPONENT MOUNTING APPARATUS

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 199 days.

(21) Appl. No.: 16/068,361

(22) PCT Filed: Nov. 29, 2016

(86) PCT No.: PCT/JP2016/085289
§ 371 (c)(1),
(2) Date: Jul. 5, 2018

(87) PCT Pub. No.: WO2017/119217
PCT Pub. Date: Jul. 13, 2017

(65) Prior Publication Data
US 2019/0027388 A1    Jan. 24, 2019

(30) Foreign Application Priority Data
Jan. 6, 2016 (JP) ................................. 2016-001047

(51) Int. Cl.
*H01L 21/677* (2006.01)
*H01L 21/67* (2006.01)
(Continued)

(52) U.S. Cl.
CPC .. *H01L 21/67718* (2013.01); *H01L 21/67144* (2013.01); *H01L 21/67259* (2013.01);
(Continued)

(58) Field of Classification Search
CPC ......... H01L 21/67714; H01L 21/67718; H01L 21/67259; H01L 21/6838; H05K 13/0409; H05K 13/0411; H05K 13/0413
See application file for complete search history.

(56) References Cited

U.S. PATENT DOCUMENTS 5,507,614 A * 4/1996 Leonov ............. H01L 21/67775
414/768
6,091,498 A * 7/2000 Hanson ............. H01L 21/67173
356/623
(Continued)

FOREIGN PATENT DOCUMENTS

JP   H1167879    3/1999
JP   4840862    12/2011
(Continued)

OTHER PUBLICATIONS

"International Search Report (Form PCT/ISA/210)" of PCT/JP2016/085289, dated Feb. 14, 2017, with English translation thereof, pp. 1-2.

*Primary Examiner* — Saul Rodriguez
*Assistant Examiner* — Ashley K Romano
(74) *Attorney, Agent, or Firm* — JCIPRNET

(57) ABSTRACT

A flip-chip bonding apparatus for mounting semiconductor chips on a circuit board is provided with: a mounting head, to which a plurality of mounting nozzles for moving, in the vertical direction, mounting tools for vacuum-sucking the semiconductor chips are attached by being aligned in the Y direction, said mounting head moving in the Y direction; and an electronic component handling unit, that moves in the X direction perpendicular to the Y direction, picks up the semiconductor chips such that the semiconductor chips are aligned in the X direction, inverts the semiconductor chips, and at the same time, changes the alignment direction of the semiconductor chips from the X direction to the Y direction. Consequently, in the electronic component mounting apparatus, installation area can be saved and bonding speed can be increased with the simple configuration.

14 Claims, 15 Drawing Sheets

(51) Int. Cl.
*H01L 21/68* (2006.01)
*H05K 13/04* (2006.01)
*H01L 21/683* (2006.01)

(52) U.S. Cl.
CPC ..... *H05K 13/0409* (2018.08); *H05K 13/0411* (2018.08); *H05K 13/0413* (2013.01); *H01L 21/6838* (2013.01)

(56) References Cited

U.S. PATENT DOCUMENTS

| | | | | |
|---|---|---|---|---|
| 6,368,040 | B1 * | 4/2002 | Yamasaki | H01L 21/67781 414/225.01 |
| 6,558,750 | B2 * | 5/2003 | Gramarossa | C25D 7/12 205/123 |
| 6,816,251 | B2 * | 11/2004 | Swan | G01N 21/9506 250/559.36 |
| 8,662,818 | B2 * | 3/2014 | Wilke | G02B 21/34 414/754 |

FOREIGN PATENT DOCUMENTS

| | | |
|---|---|---|
| JP | 2012023230 | 2/2012 |
| JP | 2015060924 | 3/2015 |

* cited by examiner

ELECTRONIC COMPONENT MOUNTING APPARATUS

CROSS-REFERENCE TO RELATED APPLICATION

This application is a 371 application of the international PCT application serial no. PCT/JP2016/085289, filed on Nov. 29, 2016, which claims the priority benefit of Japan application no. 2016-001047, filed on Jan. 6, 2016. The entirety of each of the abovementioned patent applications is hereby incorporated by reference herein and made a part of this specification.

TECHNICAL FIELD

The present invention relates to a structure of an electronic component mounting apparatus that mounts electronic components such as semiconductor chips on a circuit board.

BACKGROUND ART

As a method of mounting semiconductor chips on a circuit board, a flip-chip bonding method is frequently used. In this method, bumps are formed on a semiconductor chip by soldering or the like, the semiconductor chip is picked up from a wafer and inverted, a surface of the semiconductor chip on a side opposite to the bumps is adsorbed by a bonding tool, and the bumps of the semiconductor chip are thermo-compression bonded to electrodes of a circuit board using the bonding tool to bond the bumps to the electrodes of the circuit board (see, for example, Patent Literature 1).

A flip-chip bonder (flip-chip bonding apparatus) is used as an apparatus for mounting a semiconductor chip onto a circuit board using such a flip-chip bonding method (see, for example, Patent Literature 2). A flip-chip bonding apparatus 900 described in Patent Literature 2 is illustrated in FIG. 15. The flip-chip bonding apparatus 900 includes a chip supply unit 901 that supplies a semiconductor chip 910 to be mounted on a circuit board 912, a pickup unit 902 that picks up the semiconductor chip 910 from a wafer 911, an inversion mechanism 903 that inverts the picked up semiconductor chip 910, a bonding unit 904 that receives the inverted semiconductor chip 910 and bonds the inverted semiconductor chip 910 to the circuit board 912, a camera 908 that captures images of the circuit board 912 and the semiconductor chip 910, and a conveying unit 915 that conveys the circuit board 912. The chip supply unit 901, the pickup unit 902, the inversion mechanism 903, and the bonding unit 904 are disposed in a line in a Y direction. The chip supply unit 901 includes a push-up unit 909 that pushes up the semiconductor chip 910 to be picked up. Further, the pickup unit 902 includes a pickup tool 905 that adsorbs the semiconductor chip 910 and a pickup head 902a that drives the pickup tool 905 in a Z direction, and the bonding unit 904 includes a bonding tool 906 that bonds the semiconductor chip 910 and a bonding head 904a that drives the bonding tool 906 in the Z direction. The pickup head 902a and the bonding head 904a are moved in the Y direction by a Y direction drive mechanism 907.

CITATION LIST

Patent Literature

[Patent Literature 1]
Japanese Patent No. 4840862

[Patent Literature 2]
Japanese Unexamined Patent Application, First Publication No. 2015-60924

SUMMARY OF INVENTION

Technical Problem

Incidentally, in recent years, there has been strengthening demand for space-saving regarding an installation area for a flip-chip bonding apparatus and speeding up of bonding. As a method for realizing this, in a conventional technology of a flip-chip bonding apparatus 900 illustrated in FIG. 15, it is conceivable to mount two bonding heads 904a and two bonding tools 906 as well as two pickup heads 902a and two pickup tools 905 thereon, and increase a size of an inversion mechanism 903 so that the two pickup heads 902a and the two pickup tools 905 can be simultaneously inverted. However, in the flip-chip bonding apparatus applied with such a conventional technology described in Patent Literature 2, there is a problem in that the increased size of the inversion mechanism 903 causes a length of a Y direction drive mechanism 907 to increase, and thus an installation area thereof increases.

Therefore, it is an objective of the present invention to realize space-saving in installation area and speeding up in bonding with a simple configuration in an electronic component mounting apparatus.

Solution to Problem

An electronic component mounting apparatus of the present invention is an electronic component mounting apparatus that mounts electronic components on a substrate or other electronic components, and includes a mounting head including a plurality of mounting nozzles, that vertically move a plurality of mounting tools to which the electronic components are adsorbed, aligned in a Y direction and attached thereto and configured to move in the Y direction, and an electronic component handling unit moving in an X direction perpendicular to the Y direction to pick up the plurality of electronic components to be aligned in the X direction and configured to invert the plurality of electronic components and simultaneously change an alignment direction of the plurality of electronic components from the X direction in the Y direction.

In the electronic component mounting apparatus of the present invention, it is preferable that the electronic component handling unit include a main body linearly moving in the X direction, a rotating shaft attached to the main body to be inclined by about 45° with respect to the X direction in which the main body moves, a flip head attached to the rotating shaft and in which a plurality of pickup nozzles that adsorb and hold the electronic components are disposed in a straight line, and an inversion drive mechanism attached to the main body and configured to rotate the rotating shaft to invert the flip head, and the plurality of pickup nozzles be arranged to be inclined by about 45° with respect to a direction in which the rotating shaft extends.

In the electronic component mounting apparatus of the present invention, it is preferable that an arrangement pitch of the plurality of mounting tools be the same as an arrangement pitch of the plurality of pickup nozzles.

In the electronic component mounting apparatus of the present invention, it is preferable that the flip head include a base connected to the rotating shaft, the rotating shaft be connected to an upper surface of the base and the pickup nozzles be attached to a lower surface of the base, and the upper surface of the base deviate from a central line of the rotating shaft in a direction of a distal end of the pickup nozzle.

An electronic component mounting apparatus of the present invention is an electronic component mounting apparatus that mounts electronic components on a substrate or other electronic components, and includes a first mounting head including a plurality of first mounting nozzles, that vertically move a plurality of first mounting tools to which the electronic components are adsorbed, aligned in a Y direction and attached thereto and configured to move in the Y direction, a first electronic component handling unit moving in an X direction perpendicular to the Y direction to pick up the plurality of electronic components to be aligned in the X direction and configured to invert the plurality of electronic components and simultaneously change an alignment direction of the plurality of electronic components from the X direction in the Y direction, a second mounting head including a plurality of second mounting nozzles, that vertically move a plurality of second mounting tools to which the electronic components are adsorbed, aligned in the Y direction and attached thereto and disposed parallel to the first mounting head, and a second electronic component handling unit disposed parallel to and facing the first electronic component handling unit, moving parallel to the first electronic component handling unit to pick up the plurality of electronic components to be aligned in the X direction, and configured to invert the plurality of electronic components and simultaneously change an alignment direction of the plurality of electronic components from the X direction in the Y direction.

In the electronic component mounting apparatus of the present invention, it is preferable that the first electronic component handling unit include a first main body linearly moving in a direction perpendicular to an arrangement direction, a first rotating shaft attached to the first main body to be inclined by about 45° with respect to a direction in which the first main body moves, a first flip head attached to the first rotating shaft and in which a plurality of first pickup nozzles that adsorb and hold the electronic components are disposed in a straight line, and a first inversion drive mechanism attached to the first main body and configured to rotate the first rotating shaft to invert the first flip head, the first pickup nozzles be arranged to be inclined by about 45° with respect to a direction in which the first rotating shaft extends, the second electronic component handling unit include a second main body disposed to face the first main body and configured to linearly move parallel to the first main body, a second rotating shaft attached to the second main body and configured to extend in a direction parallel to the first rotating shaft, a second flip head attached to the second rotating shaft and in which a plurality of second pickup nozzles that adsorb and hold the electronic components are disposed in a straight line, and a second inversion drive mechanism attached to the second main body and configured to rotate the second rotating shaft to invert the second flip head, and the second pickup nozzles be arranged to be inclined by about 45° with respect to a direction in which the second rotating shaft extends.

In the electronic component mounting apparatus of the present invention, it is preferable that an arrangement pitch of the plurality of first mounting tools be the same as an arrangement pitch of the plurality of first pickup nozzles or the plurality of second pickup nozzles, and an arrangement pitch of the plurality of second mounting tools be the same as the arrangement pitch of the plurality of first pickup nozzles or the plurality of second pickup nozzles.

In the electronic component mounting apparatus of the present invention, it is preferable that the first flip head and the second flip head be movable on one straight line parallel to a movement direction of the first main body and the second main body in a state in which the first flip head and the second flip head are not inverted, the first electronic component handling unit be able to pass by the second electronic component handling unit in which the second flip head is not inverted in a movement direction in a state in which the first flip head of the first electronic component handling unit is inverted, and the second electronic component handling unit be able to pass by the first electronic component handling unit in which the first flip head is not inverted in a movement direction in a state in which the second flip head of the second electronic component handling unit is inverted.

In the electronic component mounting apparatus of the present invention, it is preferable that the first flip head include a first base connected to the first rotating shaft, the second flip head include a second base connected to the second rotating shaft, the first rotating shaft be connected to a first upper surface of the first base and the first pickup nozzles be attached to a first lower surface of the first base, the second rotating shaft be connected to a second upper surface of the second base and the second pickup nozzles be attached to a second lower surface of the second base, the first upper surface of the first base deviate from a first central line of the first rotating shaft in a direction of a distal end of the first pickup nozzle, and the second upper surface of the second base deviate from a second central line of the second rotating shaft in a direction of a distal end of the second pickup nozzle.

In the electronic component mounting apparatus of the present invention, it is preferable that the first flip head be shifted from an intersection point of the first central line of the first rotating shaft and the one straight line to a base side of the first rotating shaft along the one straight line and be attached to the first rotating shaft, the second flip head be shifted from an intersection point of the second central line of the second rotating shaft and the one straight line to a base side of the second rotating shaft along the one straight line and be attached to the second rotating shaft, a shift amount of the first flip head be larger than an amount of a protrusion of the second flip head from the one straight line to the first main body side when the second flip head is not inverted, and a shift amount of the second flip head be larger than an amount of a protrusion of the first flip head from the one straight line to the second main body side when the first flip head is not inverted.

In the electronic component mounting apparatus of the present invention, it is preferable that the electronic component mounting apparatus include a wafer holder that holds a diced wafer, and a push-up unit disposed on a lower side of the wafer holder and configured to push up the wafer, in which the wafer holder moves only in the Y direction, and the push-up unit moves only in the X direction.

Advantageous Effects of Invention

The present invention can realize space-saving regarding an installation area and speeding up in bonding with a simple configuration in an electronic component mounting apparatus.

DESCRIPTION OF EMBODIMENTS

Hereinafter, a flip-chip bonding apparatus 100 that is an embodiment of an electronic component mounting apparatus of the present invention will be described with reference to the drawings.

Figure 1:
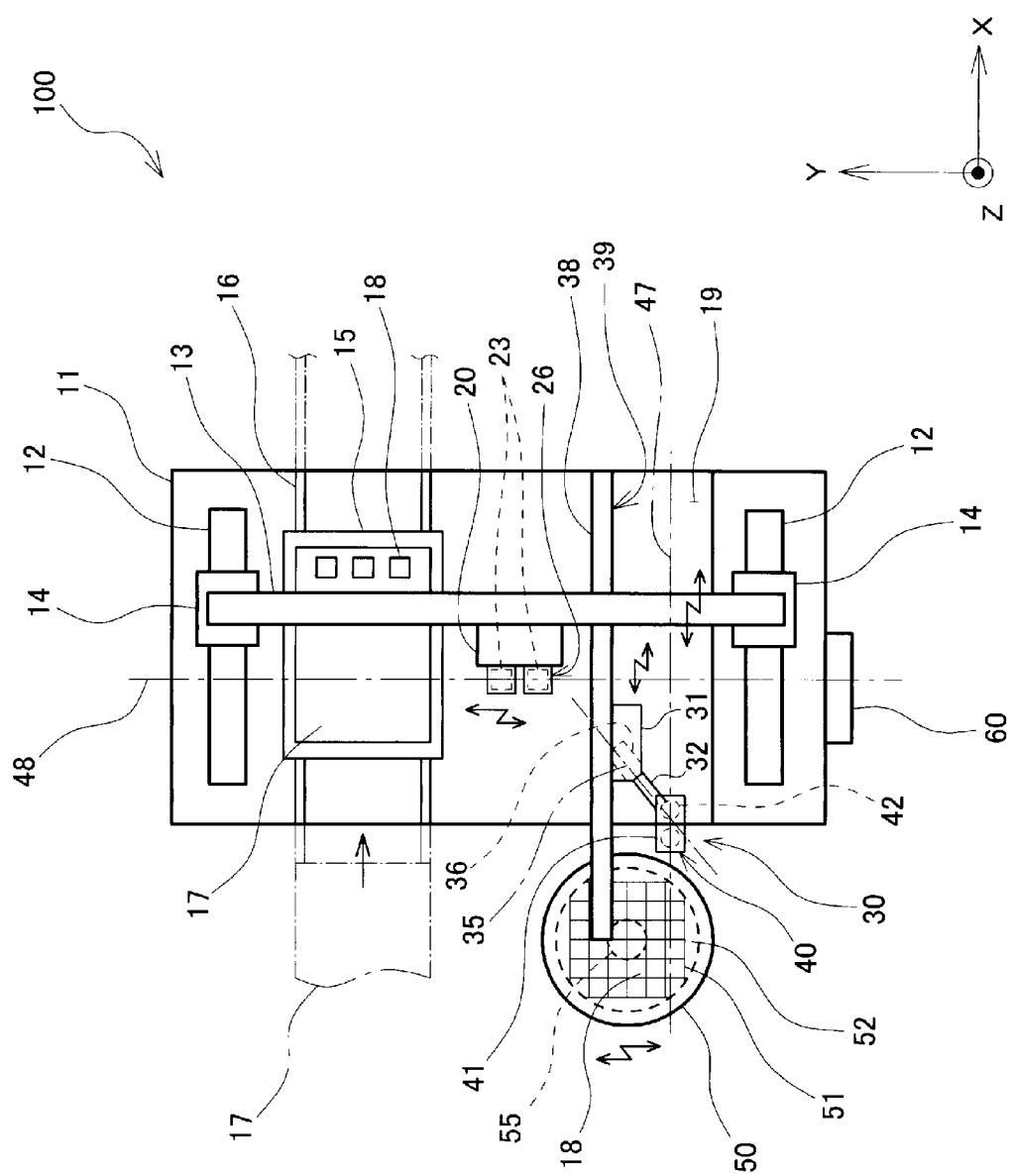
FIG. 1 is a plan view illustrating a configuration of a flip-chip bonding apparatus of one embodiment of the present invention.

As illustrated in FIG. 1, the flip-chip bonding apparatus 100 includes a frame 11, a mounting stage 15, a gantry frame 13 extending in a Y direction across and above the mounting stage 15 and moving in an X direction, a mounting head 20 attached to the gantry frame 13 and moving in the Y direction, a mounting nozzle 26 attached to the mounting head 20 and configured to move a mounting tool 23 in a Z direction, a wafer holder 50, an electronic component handling unit 30 that performs picking up, inverting, and delivering of a semiconductor chip 18, and a control unit 60 that controls an operation of each unit. As illustrated in FIG. 1, description will be made assuming that a direction in which the gantry frame 13 extends is the Y direction, a direction perpendicular thereto is the X direction, and a vertical direction perpendicular to an XY plane is the Z direction.

The mounting stage 15 vacuum-adsorbs a circuit board 17, on which a semiconductor chip 18 that is an electronic component is mounted, to a surface thereof, and heats the circuit board 17 adsorbed to the surface using a heater (not illustrated) provided therein. The mounting stage 15 is fixed to the frame 11. The mounting stage 15 is connected to a conveying rail 16 that conveys the circuit board 17 from a substrate supply unit (not illustrated) onto the mounting stage 15 and sends the circuit board 17 on which mounting of the semiconductor chip 18 has been completed to a product stock (not illustrated).

The gantry frame 13 is a gate-shaped frame, and leg portions thereof are fixed onto a slider 14 that slides in the X direction on two guide rails 12 fixed onto the frame 11 and extending in the X direction. Since the slider 14 is moved in the X direction by an X direction drive motor (not illustrated), the gantry frame 13 is moved in the X direction by the X direction drive motor.

Figure 2:
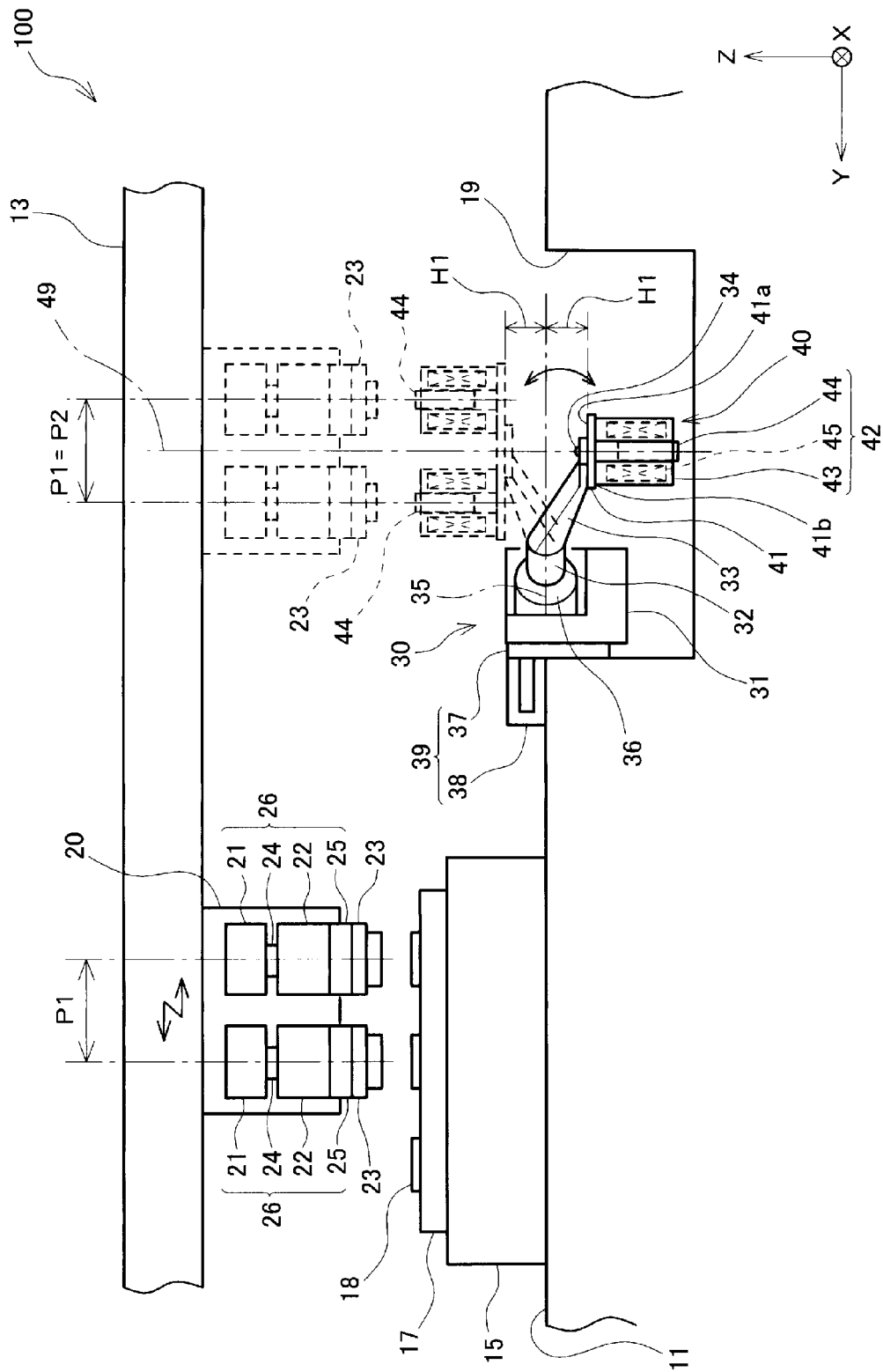
FIG. 2 is an elevational view illustrating a configuration of the flip-chip bonding apparatus of one embodiment of the present invention.

As illustrated in FIG. 2, the mounting head 20 is attached to the gantry frame 13 and is moved in the Y direction by a Y direction drive motor (not illustrated). When the gantry frame 13 is moved in the X direction by the X direction drive motor, since the mounting head 20 is moved in the X direction together with the gantry frame 13, the mounting head 20 is moved in a horizontal direction (X and Y directions) by the X direction drive motor and the Y direction drive motor. Two mounting nozzles 26 are aligned at a pitch P1 in the Y direction and attached to the mounting head 20. Each of the mounting nozzles 26 includes a motor 21 fixed to the mounting head 20, a base portion 22 attached to the mounting head 20 to be movable in the Z direction, a ball screw 24 that drives the base portion 22 in the Z direction in accordance with rotation of the motor 21, and a pulse heater 25 attached to a lower side of the base portion 22. The mounting tool 23 that adsorbs the semiconductor chip 18 and thermo-compression bonds the semiconductor chip 18 onto the circuit board 17 is attached to a lower side of the pulse heater 25. A vacuum hole that vacuum-adsorbs the semiconductor chip 18 is provided at a center of the mounting tool 23. When the base portion 22 is moved in the Z direction by the motor 21, the mounting tool 23 also moves in the Z direction in accordance therewith. Further, the pitch P1 of the two mounting nozzles 26 is the same as a pitch P2 of two pickup nozzles 42 mounted on the electronic component handling unit 30 to be described below.

Although the mounting head 20 is movable in the X and Y directions, description below will be made assuming that a center of the mounting tool 23 moves in the Y direction on a dashed-dotted line 48 illustrated in FIG. 1 when the mounting head 20 moves in the Y direction.

The wafer holder 50 is an annular member that holds a diced wafer 51. As illustrated in FIG. 1, in the flip-chip bonding apparatus 100 of the present embodiment, the wafer holder 50 is disposed on a lateral side in the X direction of the frame 11. Therefore, unlike a flip-chip bonding apparatus 900 described in a conventional technology, a length thereof is not increased and an installation area can be decreased. Further, as illustrated in FIG. 1, the wafer holder 50 is moved in the Y direction by the Y direction drive motor (not illustrated).

A push-up unit 55 that pushes the semiconductor chip 18 of the wafer 51 upward is disposed under the wafer holder

50. The push-up unit 55 is moved in the X direction by the X direction drive motor (not illustrated). This is because, since the electronic component handling unit 30 to be described below picks up the semiconductor chips 18 in sequence while moving in the X direction, the push-up unit 55 need only move in the X direction only like the electronic component handling unit 30, and when the wafer holder 50 can move only in the Y direction perpendicular to the X direction that is the movement direction of the electronic component handling unit 30, all of the semiconductor chips 18 on the wafer 51 can be picked up.

Figure 3:
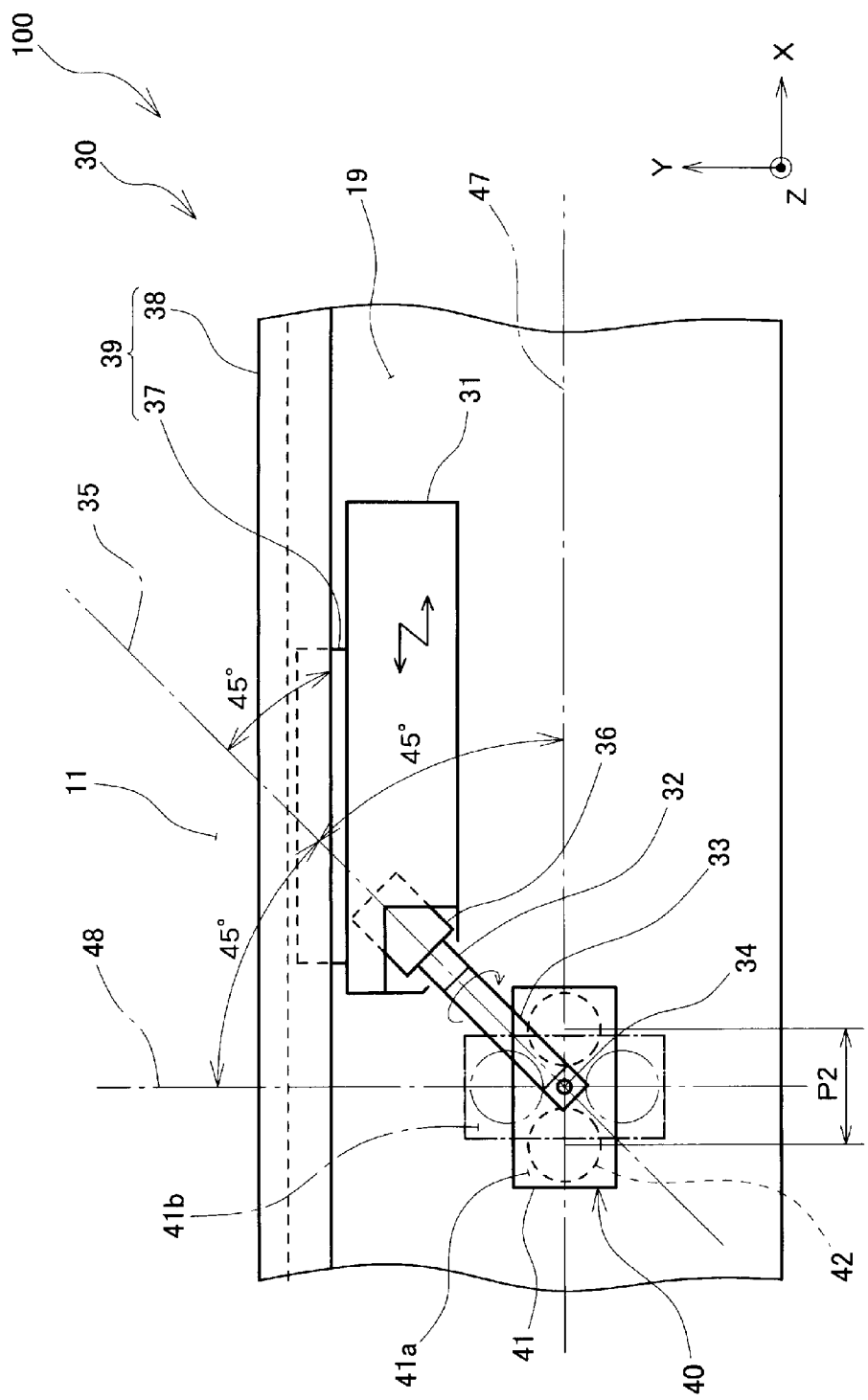
FIG. 3 is a plan view of an electronic component handling unit mounted on the flip-chip bonding apparatus of one embodiment of the present invention.
Figure 4:
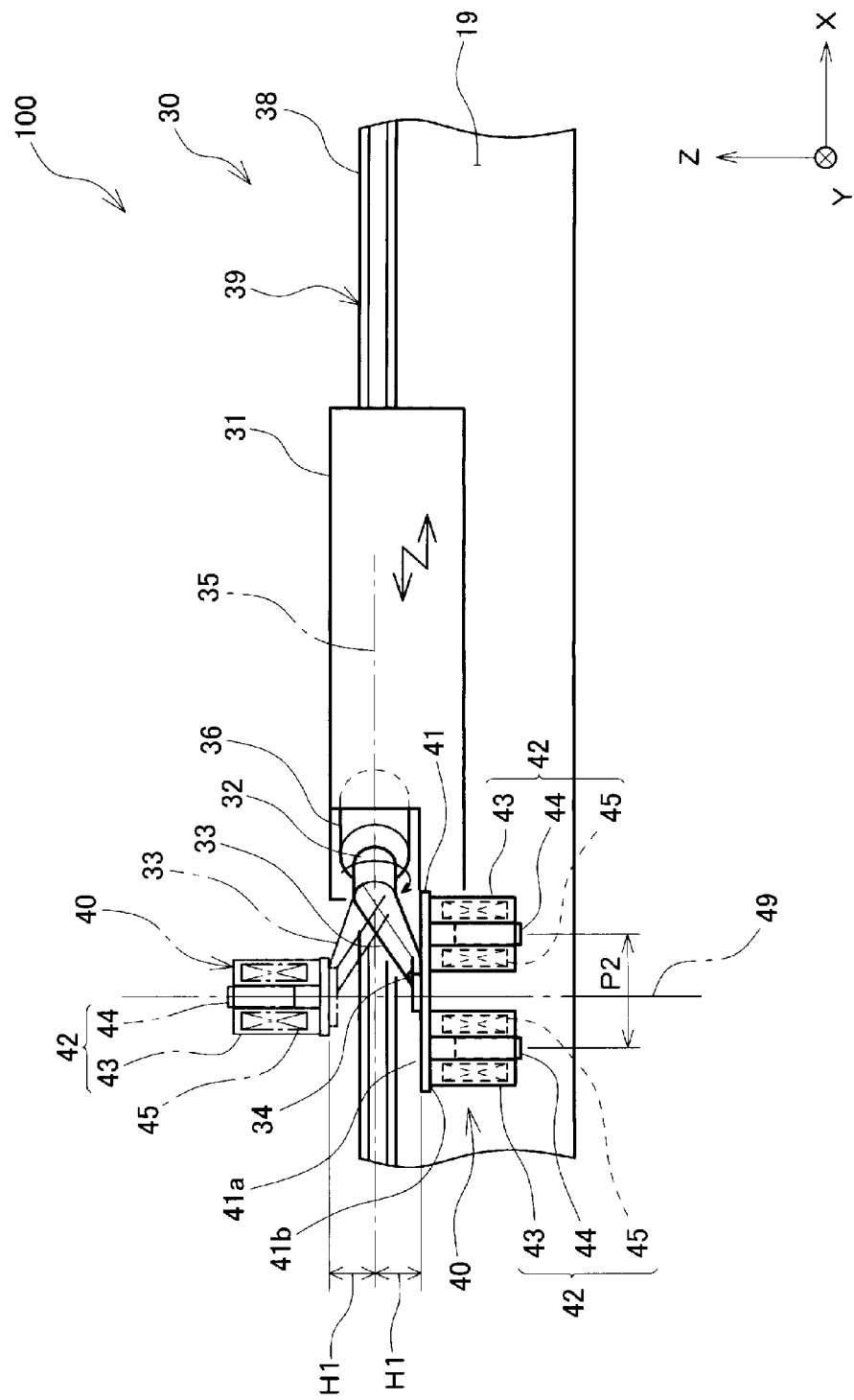
FIG. 4 is an elevational view of the electronic component handling unit mounted on the flip-chip bonding apparatus of one embodiment of the present invention.

As illustrated in FIGS. 3 and 4, the electronic component handling unit 30 includes a guide rail 38 fixed to a groove 19 extending in the X direction of the frame 11, a slider 37 guided by the guide rail 38 to move in the X direction, a main body 31 fixed to the slider 37 and moving in the X direction together with the slider 37, a rotating shaft 32 attached to the main body 31, a mounting arm 33 attached to the rotating shaft 32 and extending obliquely downward in the Z direction from a central line 35 of the rotating shaft 32, a flip head 40 fixed to a distal end of the mounting arm 33 with bolts 34, and a stepping motor 36 serving as an inversion drive mechanism that rotates the rotating shaft 32 to invert the flip head 40. Since a stator is disposed at the guide rail 38 and a mover is disposed at the slider 37, the guide rail 38 and the slider 37 constitute an X direction linear motor 39 serving as a linear drive mechanism that drives the main body 31 in the X direction.

As illustrated in FIG. 4, the flip head 40 includes a base 41 and two pickup nozzles 42 attached to a lower surface 41b of the base 41 in the Z direction. The base 41 is a plate-shaped member fixed to the distal end of the mounting arm 33 with the bolts 34, and the two pickup nozzles 42 are fixed to the lower surface 41b of the base 41 to be linearly arranged at the pitch P2 in the X direction with respect to a central line 49 of the flip head 40 in the Z direction. Further, in FIGS. 3 and 4, the flip head 40 illustrated by a solid line illustrates a case in which the pickup nozzles 42 face downward (a state in which an upper surface 41a of the base 41 can be seen), and the flip head 40 illustrated by a dashed-dotted line illustrates a case in which the flip head 40 is inverted, and thereby the lower surface 41b faces upward in the Z direction, and the pickup nozzles 42 also face upward.

In FIG. 3, a dashed-dotted line 47 indicates an alignment direction of the two pickup nozzles 42 when the pickup nozzles 42 face downward. As illustrated in FIG. 3, the arrangement direction of the pickup nozzles 42 (a direction in which the dashed-dotted line 47 extends) is inclined by about 45° in an X axis direction from the central line 35 (a direction in which the rotating shaft 32 extends) of the rotating shaft 32. When the main body 31 is moved in the X direction by the X direction linear motor 39, the two pickup nozzles 42 of the flip head 40 move in the X direction on the dashed-dotted line 47. Further, since the direction in which the dashed-dotted line 47 extends is the X direction and the main body 31 moves in the X direction, the extending direction of the rotating shaft 32 is also inclined by about 45° with respect to a movement direction of the main body 31.

As illustrated in FIGS. 2 and 4, since the mounting arm 33 extends obliquely downward in the Z direction from the central line 35 of the rotating shaft 32 and the base 41 is fixed to the distal end thereof with the bolts 34, the upper surface 41a of the base 41 is at a position lower than the center (the central line 35) of the rotating shaft 32 by a height H1 when the pickup nozzles 42 face downward.

As illustrated in FIG. 4, each of the pickup nozzles 42 includes a casing 43 having a columnar shape and provided with a hole extending in a longitudinal direction at a center thereof and a pickup tool 44 moving through the hole provided in the casing 43 in the longitudinal direction. An electromagnetic coil 45 is provided in the casing 43, and an extension amount of the pickup tool 44 from an end face of the casing 43 can be changed by energizing the electromagnetic coil 45. Further, the pickup tool 44 has a vacuum hole provided at a center and the semiconductor chip 18 can be vacuum-adsorbed to a distal end surface thereof.

As illustrated by a solid line in FIGS. 3 and 4, when the rotating shaft 32 is rotated by 180° by the stepping motor 36 from a state in which the pickup tool 44 faces downward, the base 41 connected to the rotating shaft 32 is rotated by 180° around the rotating shaft 32, resulting in inversion such as the upper surface 41a becoming a lower side in the Z direction and the lower surface 41b becoming an upper side in the Z direction. Thereby, the pickup tool 44 also is in a state of facing upward in the Z direction as illustrated by the dashed-dotted line in FIGS. 3 and 4.

When the base 41 is inverted, contrary to what has been described above, the alignment direction of the pickup nozzles 42 is in a direction illustrated by the dashed-dotted line 48 in a direction inclined by 45° in a Y axis direction from the central line 35 (a direction in which the rotating shaft 32 extends) of the rotating shaft 32. In this way, when the rotating shaft 32 is rotated by 180° and the base 41 is inverted, an arrangement direction of the pickup tool 44 is rotated by 90° from the X direction in the Y direction.

Further, as illustrated in FIGS. 2 and 4, when the base 41 is inverted, the upper surface 41a of the base 41 to which the mounting arm 33 is fixed is at a position higher than the central line 35 of the rotating shaft 32 by a height H1. Therefore, as illustrated in FIG. 2, a distance between the pickup tool 44 and the mounting tool 23 becomes short when the flip head 40 is inverted, and the extension amount of the pickup tool 44, to be described below, when delivering the semiconductor chip 18 from the pickup tool 44 to the mounting tool 23 can be decreased.

The motor 21, the stepping motor 36, the X direction drive motor, the Y direction drive motor, and the like of the flip-chip bonding apparatus 100 configured as described above are all controlled by the control unit 60. The control unit 60 is a computer in which a central processing unit (CPU) performing arithmetic processing and a storage unit storing operation programs or operation data are included. Hereinafter, an operation of the flip-chip bonding apparatus 100 will be described with reference to FIGS. 5 to 7.

As illustrated by a solid line in FIGS. 3 and 4, the control unit 60 moves the pickup tool 44 to above the wafer holder 50 by the X direction linear motor 39 in a state in which the flip head 40 is not inverted and the pickup tool 44 faces downward. Then, as illustrated in (a) of FIG. 5, the control unit 60 performs position adjustment so that a central position of one of the pickup nozzles 42 is right above the semiconductor chip 18 to be picked up. Further, the control unit 60 performs position adjustment so that a position of the push-up unit 55 is just below the semiconductor chip 18 to be picked up.

Next, the control unit 60 energizes the electromagnetic coil 45 of the pickup nozzle 42 to extend a distal end surface of the pickup tool 44 downward, and simultaneously pushes up the semiconductor chip 18 from below a dicing sheet 52 by the push-up unit 55. Further, the control unit 60 connects a vacuum device (not illustrated) to the pickup tool 44 to bring the vacuum hole of the pickup tool 44 into a vacuum state. Then, the semiconductor chip 18 pushed up by the push-up unit 55 and in contact with the distal end surface of the pickup tool 44 is vacuum-adsorbed to the distal end surface of the pickup tool 44. When the semiconductor chip 18 is picked up by the pickup tool 44, the control unit 60 controls an energizing current of the electromagnetic coil 45 such that the distal end surface of the pickup tool 44 is retracted until the semiconductor chip 18 is brought into close proximity with the end surface of the casing 43 as illustrated in (b) of FIG. 5.

Figure 5:
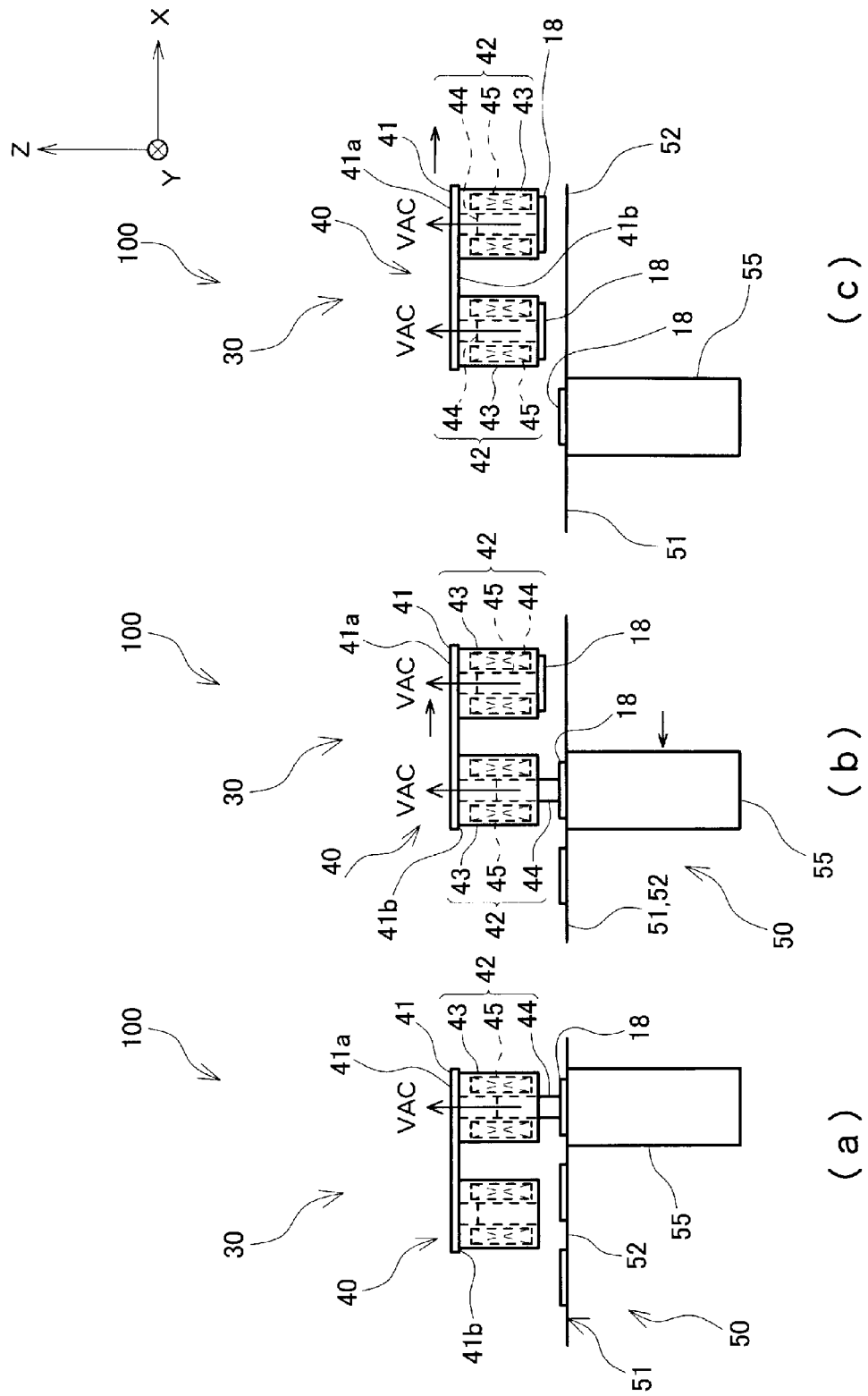
FIG. 5 is an explanatory view illustrating an operation of picking up a semiconductor chip by the flip-chip bonding apparatus of one embodiment of the present invention.

Next, as illustrated in (b) of FIG. 5, the control unit 60 drives the X direction linear motor 39 illustrated in FIG. 3 to move the flip head 40 in the X direction, and performs position adjustment so that a position of another pickup tool 44 is right above the semiconductor chip 18 to be picked up next and a position of the push-up unit 55 is just below the semiconductor chip 18 to be picked up next. Then, as in the previous operation, the control unit 60 energizes the electromagnetic coil 45 of the pickup nozzle 42 such that the pickup tool 44 protrudes downward, and simultaneously pushes up the semiconductor chip 18 from below the dicing sheet 52 by the push-up unit 55 so that the next semiconductor chip 18 is vacuum-adsorbed to the distal end surface of the pickup tool 44. When the next semiconductor chip 18 is picked up by the pickup tool 44, the control unit 60 controls the energizing current of the electromagnetic coil 45 such that the distal end surface of the pickup tool 44 is retracted until the semiconductor chip 18 is brought into close proximity with the end surface of the casing 43 as illustrated in (c) of FIG. 5.

When two semiconductor chips 18 are picked up by the two pickup nozzles 42, the control unit 60 moves the electronic component handling unit 30 in the X direction using the X direction linear motor 39 illustrated in FIG. 3. Accordingly, as illustrated in (c) of FIG. 5 and (a) of FIG. 6, the two pickup nozzles 42 to which the semiconductor chips 18 are vacuum-adsorbed also move in the X direction. At this time, the two pickup nozzles 42 of the flip head 40 move in the X direction on the dashed-dotted line 47 as described with reference to FIG. 3.

Figure 6:
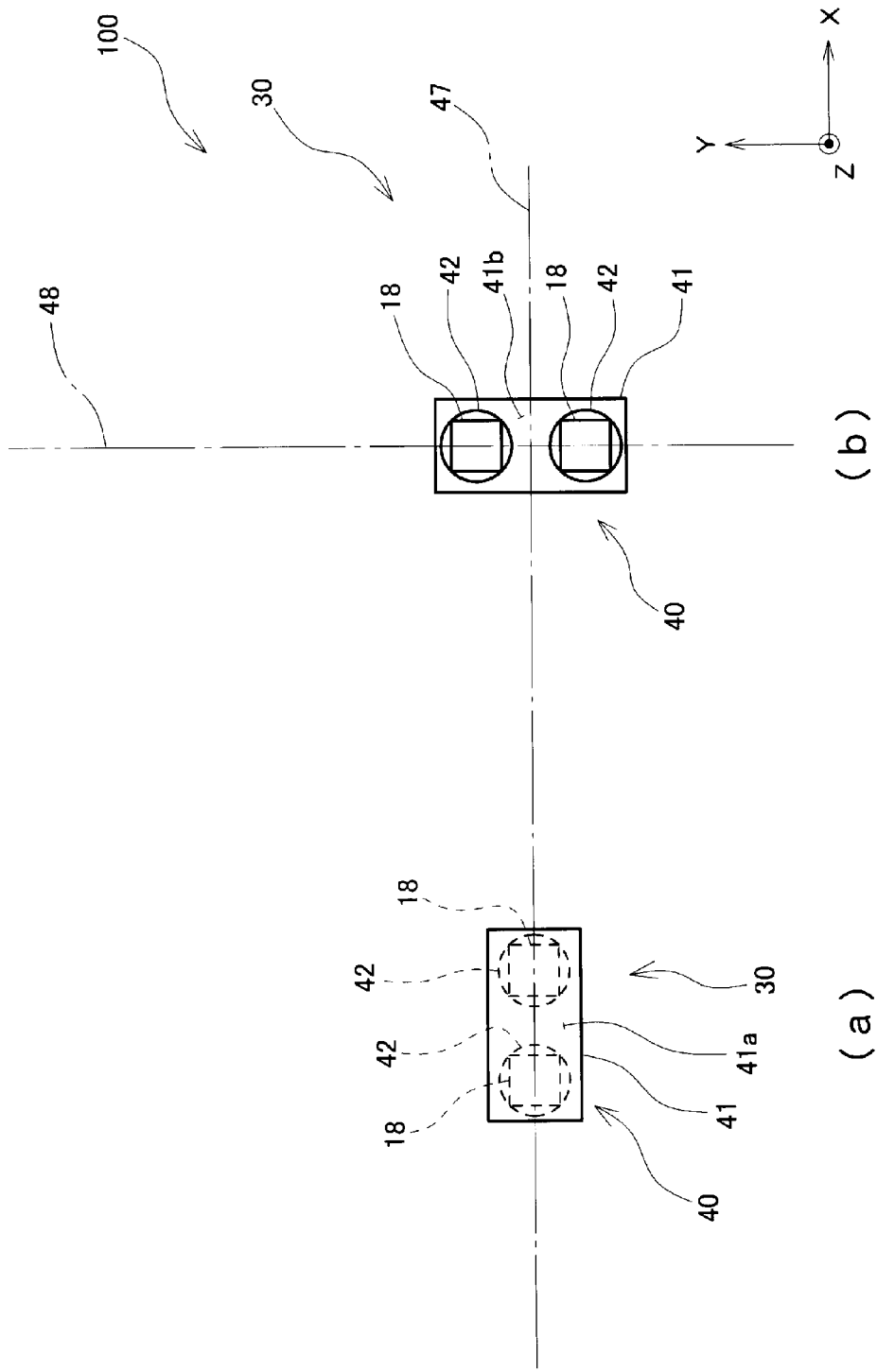
FIG. 6 is an explanatory view illustrating an operation of inverting a semiconductor chip by the flip-chip bonding apparatus of one embodiment of the present invention.

When the flip head 40 is moved to a position to be inverted, as described above, the control unit 60 rotates the rotating shaft 32 by 180° by the stepping motor 36 illustrated in FIGS. 3 and 4 to invert the flip head 40. Then, as described above with reference to FIGS. 3 and 4, the base 41 is inverted and the two pickup nozzles 42 are turned upward. Further, as illustrated in (b) of FIG. 6, the alignment direction of the two pickup nozzles 42 is the Y direction rotated by 90° from the X direction before the inversion. The dashed-dotted line 48 in (b) of FIG. 6 is a line indicating the alignment direction of the two pickup nozzles 42 after the flip head 40 is inverted, and is also a line along which a center of the two mounting tools 23 moves in the Y direction when the two mounting tools 23 move in the Y direction.

Figure 7:
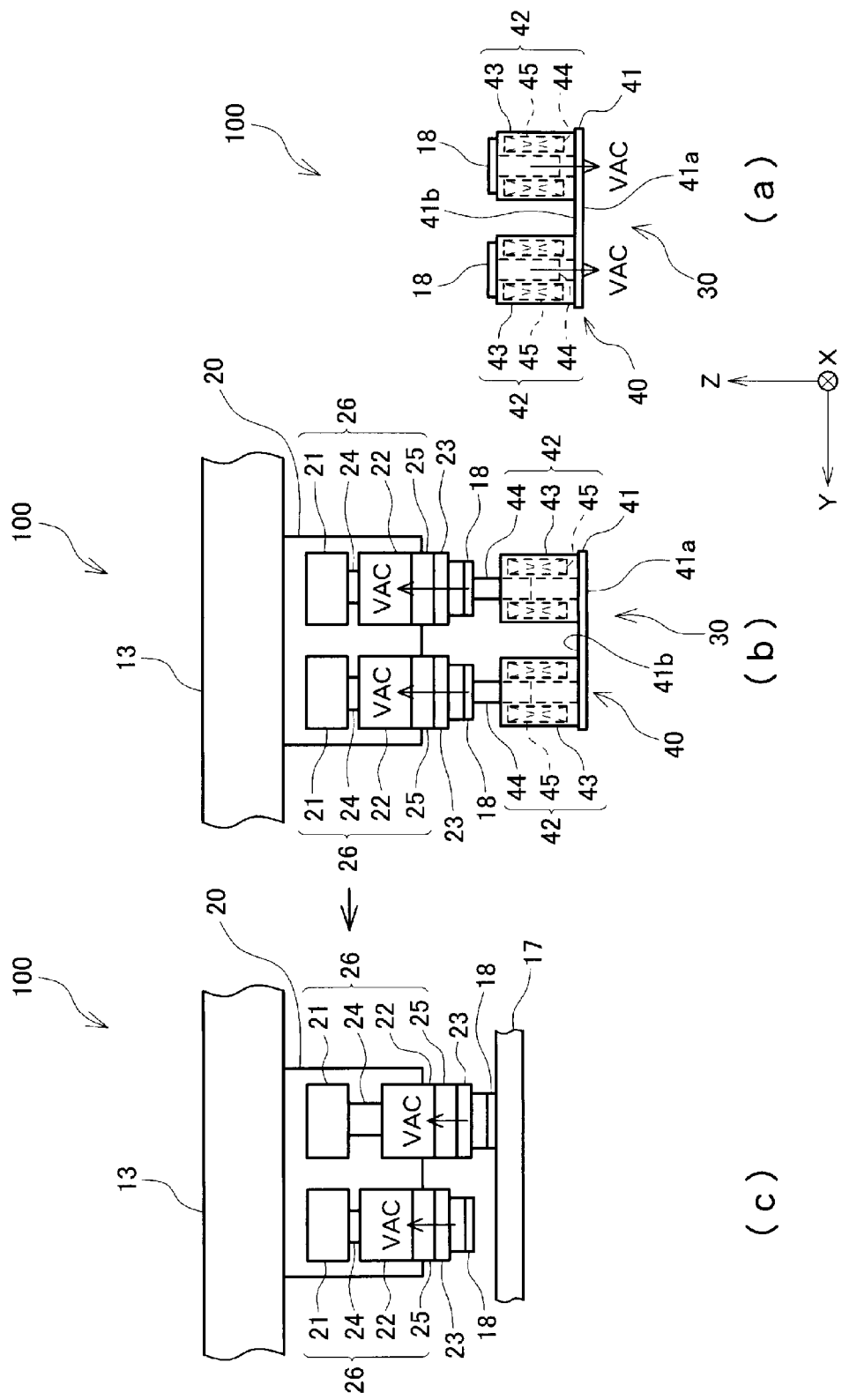
FIG. 7 is an explanatory view illustrating a semiconductor chip delivering operation from the electronic component handling unit to a bonding tool and a semiconductor chip bonding operation in the flip-chip bonding apparatus of one embodiment of the present invention.

As illustrated in (a) of FIG. 7, in a state in which the flip head 40 is inverted, the distal end surface of the pickup tool 44 is in a retracted state, and the semiconductor chip 18 is vacuum-adsorbed to the distal end surface of the pickup tool 44.

When the flip head 40 is inverted as illustrated by a broken line in FIG. 2, the control unit 60 operates the Y direction drive motor such that the mounting head 20 is moved to right above the inverted flip head 40 as illustrated in FIG. 2. At this time, the centers of the two mounting tools 23 move in the Y direction along the dashed-dotted line 48 illustrated in FIGS. 1 and 6 (b). As described above, since the pitch P1 of the two mounting nozzles 26 is the same as the pitch P2 of the two pickup nozzles 42, when the mounting heads 20 come to right above the inverted pickup nozzles 42 as illustrated in FIG. 2, center positions of the two mounting tools 23 and center positions of the two pickup tools 44 are respectively coincident with each other.

As illustrated in (b) of FIG. 7, the control unit 60 energizes each electromagnetic coil 45 of each of the pickup nozzles 42 to extend each of the distal end surfaces of the pickup tools 44. As a result, the semiconductor chip 18 adsorbed to the distal end surface of the pickup tool 44 is brought into close proximity with a surface of the mounting tools 23. Then, the control unit 60 releases a vacuum state of the vacuum suction hole of the pickup tool 44, and brings the vacuum hole of the mounting tool 23 into a vacuum state. Then, the semiconductor chip 18 is separated from the distal end surface of the pickup tool 44 and vacuum-adsorbed to the surface of the mounting tool 23. In this manner, the semiconductor chips 18 are delivered from the two pickup tools 44 to the two mounting tools 23.

When the semiconductor chips 18 are delivered from the two pickup tools 44 to the two mounting tools 23, the control unit 60 adjusts a current of the electromagnetic coils 45 of the pickup nozzles 42 to retract the distal end surfaces of the pickup tools 44 to an original state, and rotates the stepping motor 36 by 180° in a direction opposite to the direction at the time of inversion to return the flip head 40 to an original state (non-inverted state) in which the pickup nozzles 42 face downward.

When each of the mounting tools 23 and each of the second mounting tools 123 receives the semiconductor chip 18, the control unit 60 moves the mounting head 20 to above the circuit board 17 by the Y direction drive motor (not illustrated) as illustrated in (c) of FIG. 7. Then, the semiconductor chip 18 that has been vacuum-adsorbed to the mounting tool 23 is heated using the pulse heater 25 of each of the mounting nozzle 26, the motor 21 is rotated to lower the mounting tool 23 together with the base portion 22 onto the circuit board 17, and the semiconductor chip 18 is thereto-compression bonded onto the circuit board 17 by the mounting tool 23. The thermo-compression bonding of the semiconductor chip 18 may be performed one at a time in sequence or the two semiconductor chips 18 may simultaneously be thereto-compression bonded to the circuit board 17.

As described above, the electronic component handling unit 30 of the flip-chip bonding apparatus 100 of the present embodiment moves in the X direction perpendicular to the Y direction in which the mounting nozzles 26 are aligned to pick up the plurality of semiconductor chips 18 to be aligned in the X direction, and inverts the plurality of semiconductor chips 18 and simultaneously changes the alignment direction of the semiconductor chips 18 in the Y direction that is a direction in which the mounting nozzles 26 are aligned, and thereby a row of the plurality of picked up semiconductor chips 18 can be simultaneously delivered to the mounting tools 23 at the distal end of the mounting nozzle 26, and thus the bonding can be speeded up.

Further, in the flip-chip bonding apparatus 100 of the present embodiment, since it is possible to employ such a device arrangement in which the alignment direction of the mounting nozzles 26 (Y direction) and the alignment direction of the pickup nozzles 42 (X direction) are perpendicular to each other, the installation area can be decreased by disposing the wafer holder 50 on the lateral side in the X direction of the frame 11, for example.

Next, a flip-chip bonding apparatus 200 according to another embodiment of the present invention will be described with reference to FIGS. 8 to 14. Components the same as those described above with reference to FIGS. 1 to 7 are denoted by the same reference signs, and description thereof will be omitted.

Figure 8:
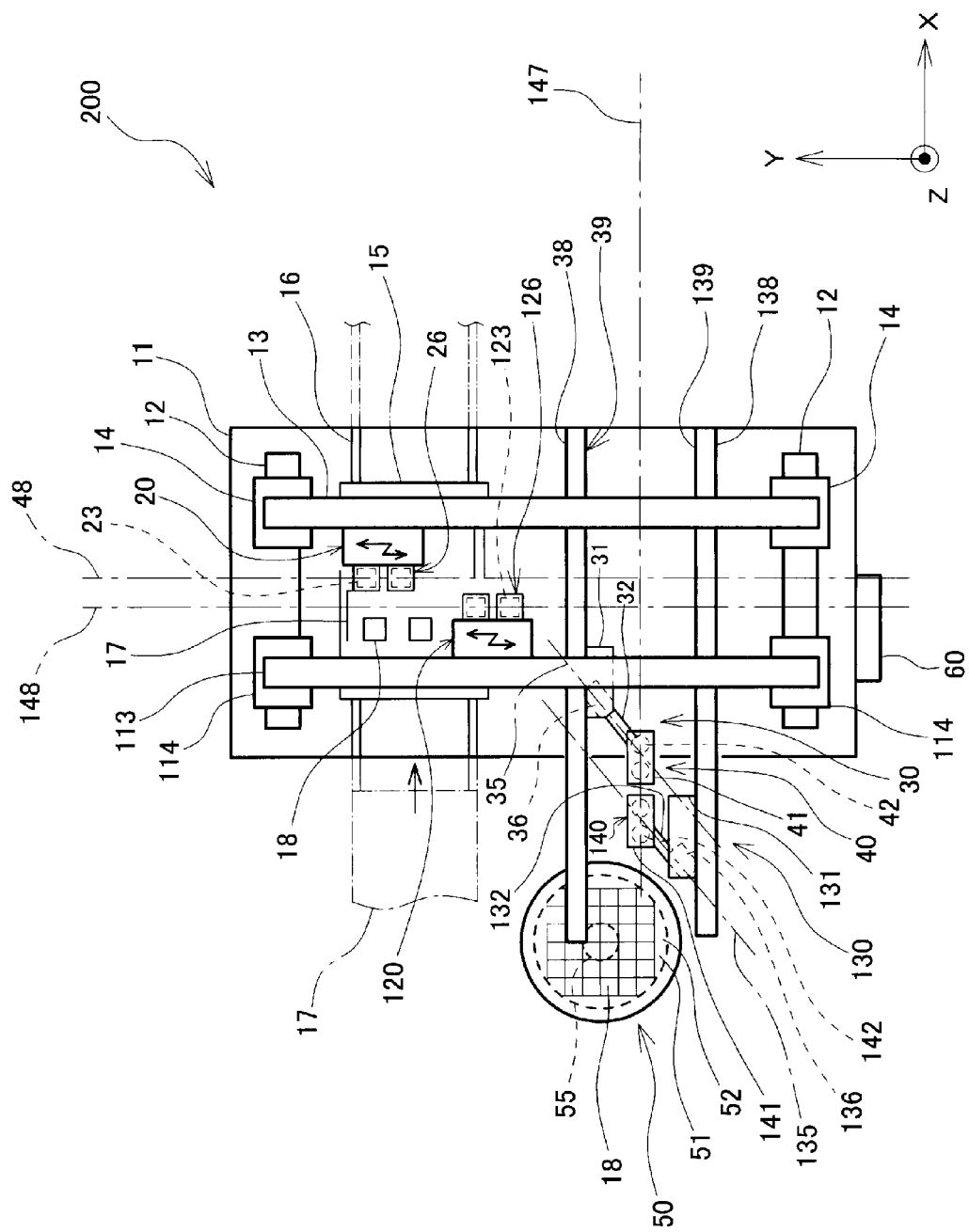
FIG. 8 is a plan view illustrating a configuration of a flip-chip bonding apparatus of another embodiment of the present invention.

As illustrated in FIG. 8, the flip-chip bonding apparatus 200 of the present embodiment includes, in addition to the flip-chip bonding apparatus 100 described with reference to FIG. 1, a second gantry frame 113, a second mounting head 120 attached to the second gantry frame 113, second mounting nozzles 126 disposed on the second mounting head 120 in parallel and having second mounting tools 123 attached to distal ends thereof, and a second electronic component handling unit 130. The flip-chip bonding apparatus 200 of the present embodiment picks up four semiconductor chips 18 aligned in an X direction by the two electronic component handling units 30 and 130, inverts the four picked up semiconductor chips 18 and simultaneously changes an alignment direction thereof in the Y direction, delivers the four semiconductor chips 18 to the four mounting tools 23 and 123, and thermo-compression bonds the semiconductor chips 18 onto a circuit board 17 by the four mounting tools 23 and 123. Configurations other than the second gantry frame 113, the second mounting head 120 attached to the second gantry frame 113, the second mounting nozzles 126 disposed on the second mounting head 120 in parallel and having the second mounting tools 123 attached to the distal ends thereof, and the second electronic component handling unit 130 are the same as configurations in the flip-chip bonding apparatus 100 described above, and description thereof will be omitted.

Further, in FIGS. 8 to 14, description will be made assuming that a direction in which the gantry frame 13 and the second gantry frame 113 illustrated in FIG. 8 extend is a Y direction, a direction perpendicular thereto is an X direction, and a vertical direction perpendicular to an XY plane is a Z direction.

As illustrated in FIG. 8, the second gantry frame 113 of the flip-chip bonding apparatus 200 is a gate-shaped frame disposed parallel to the gantry frame 13, and leg portions thereof are fixed on a second slider 114 that slides in the X direction on two guide rails 12 fixed on a frame 11 and extending in the X direction. Since the second slider 114 is moved in the X direction by a second X direction drive motor (not illustrated), the second gantry frame 113 is moved in the X direction by the second X direction drive motor.

Figure 9:
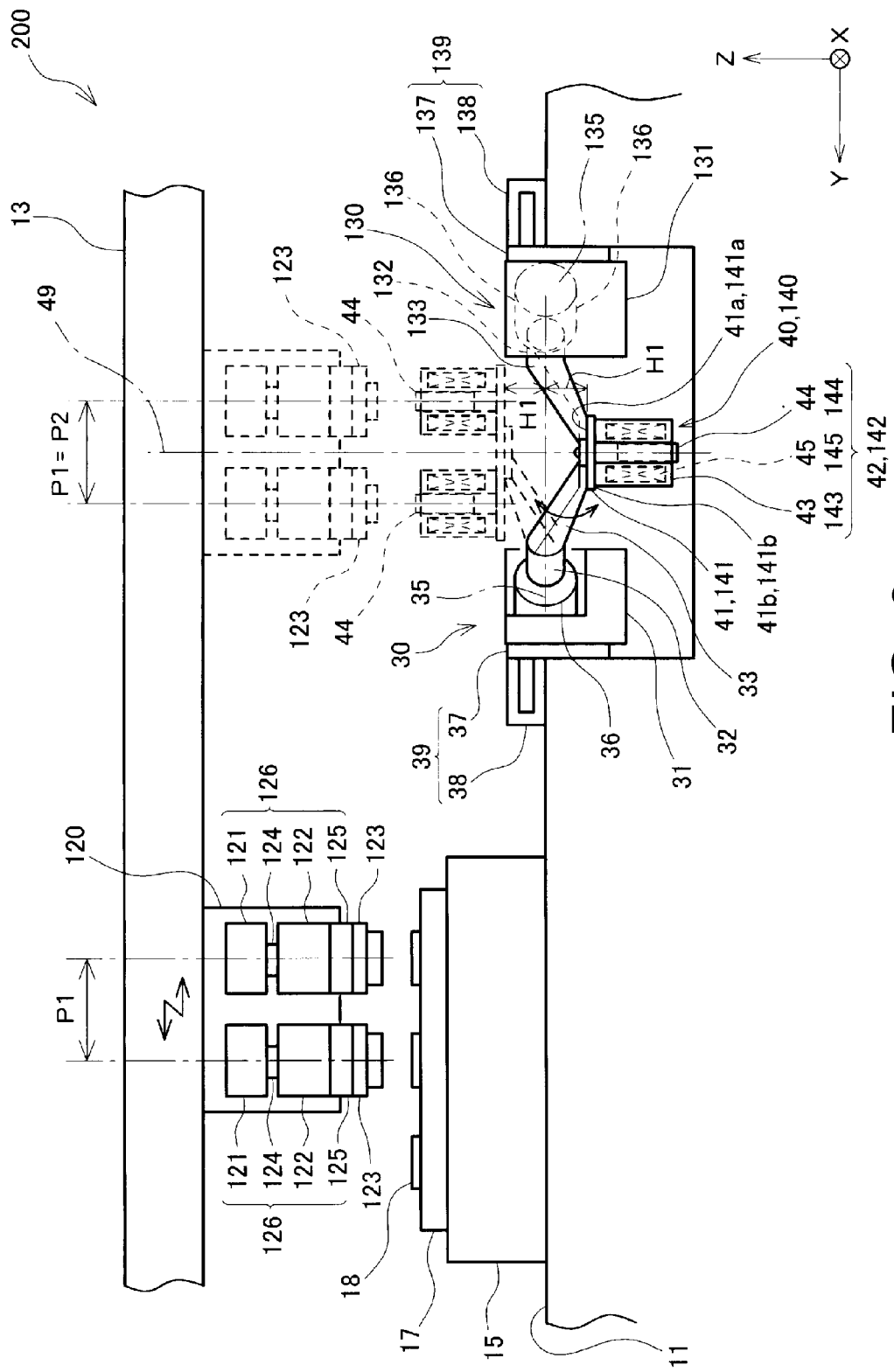
FIG. 9 is an elevational view illustrating a configuration of the flip-chip bonding apparatus of another embodiment of the present invention.

As illustrated in FIG. 9, since the second mounting head 120 is attached to the second gantry frame 113 disposed parallel to the gantry frame 13, the second mounting head 120 is disposed parallel to a mounting head 20. Further, the second mounting head 120 is moved in the Y direction by a second Y direction drive motor (not illustrated). When the second gantry frame 113 is moved in the X direction by the second X direction drive motor, the second mounting head 120 is moved in the X direction together with the second gantry frame 113, and thus the second mounting head 120 is moved in a horizontal direction (X and Y directions) by the second X direction drive motor and the second Y direction drive motor.

Two second mounting nozzles 126 are aligned at a pitch P1 in the Y direction and attached to the second mounting head 120. Each of the second mounting nozzles 126 includes a second motor 121 fixed to the second mounting head 120, a second base portion 122 attached to the second mounting head 120 to be movable in the Z direction, a second ball screw 124 that drives the second base portion 122 in the Z direction in accordance with rotation of the second motor 121, and a second pulse heater 125 attached to a lower side of the second base portion 122. Each of the second mounting tools 123 that adsorbs the semiconductor chip 18, and thermo-compression bonds the semiconductor chip 18 onto the circuit board 17 is attached to a lower side of the second pulse heater 125. A vacuum hole that vacuum-adsorbs the semiconductor chip 18 is provided at a center of the second mounting tool 123. When the second base portion 122 is moved in the Z direction by the second motor 121, the second mounting tool 23 also moves in the Z direction accordingly.

Further, the pitch P1 of the two second mounting nozzles 126 is the same as a pitch P2 of the two second pickup nozzles 142 mounted on the electronic component handling unit 30 to be described below, and is also the same as the pitch P2 of the two pick up nozzles 42 of the electronic component handling unit 30.

Although the second mounting head 120 is movable in the X and Y directions, description below will be made assuming that a center of the second mounting tool 123 moves in the Y direction on a dashed-dotted line 148 illustrated in FIG. 8 when the second mounting head 120 moves in the Y direction.

Figure 10:
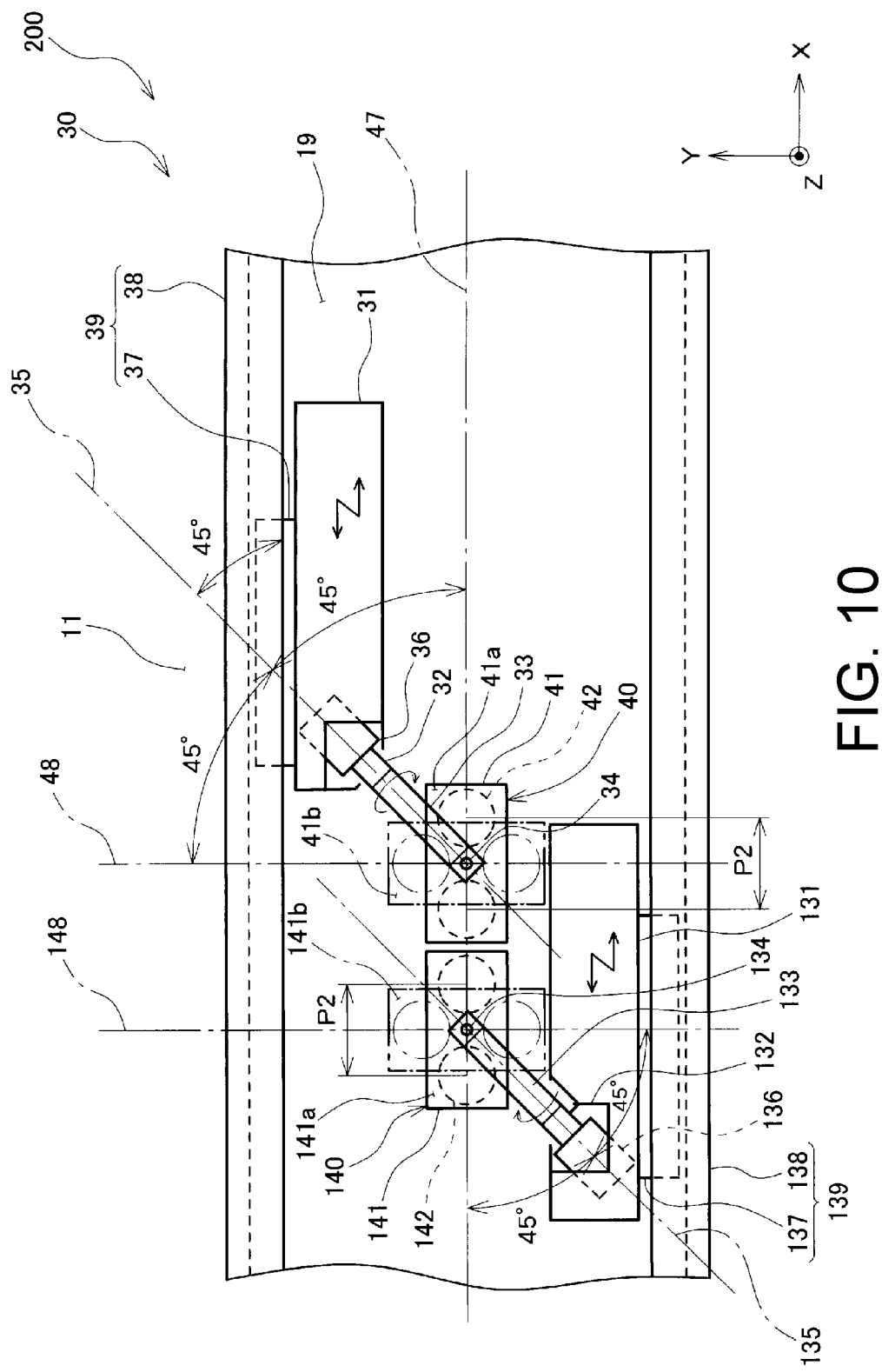
FIG. 10 is a plan view of an electronic component handling unit mounted on the flip-chip bonding apparatus of another embodiment of the present invention.
Figure 11:
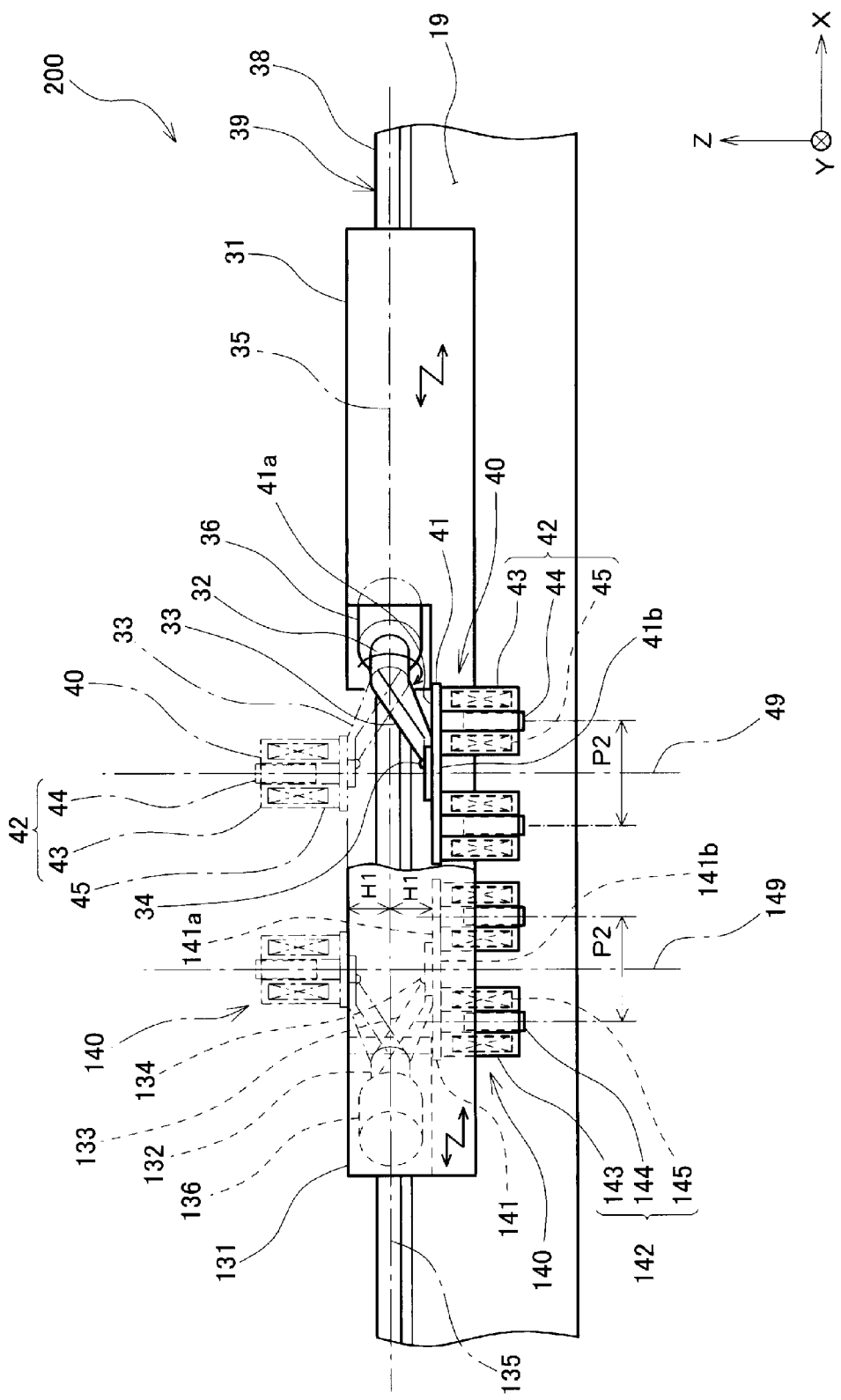
FIG. 11 is an elevational view of the electronic component handling unit mounted on the flip-chip bonding apparatus of another embodiment of the present invention.

As illustrated in FIGS. 10 and 11, the second electronic component handling unit 130 is disposed parallel to and facing the electronic component handling unit 30, moves parallel to the electronic component handling unit 30 in the X direction to pick up a plurality of the semiconductor chips 18 to be aligned in the X direction parallel to an alignment direction (Y direction) of the second mounting nozzles 126, and inverts the plurality of the semiconductor chips 18 and simultaneously changes the alignment direction of the plurality of the semiconductor chips 18 in the Y direction that is the alignment direction of the second mounting nozzles 126.

As illustrated in FIGS. 10 and 11, the second electronic component handling unit 130 includes a second guide rail 138, a second slider 137, a second main body 131, a second rotating shaft 132 attached to the second main body 131, a second mounting arm 133, a second flip head 140 fixed to a distal end of the second mounting arm 133, and a second stepping motor 136.

The second guide rail 138 is fixed to a groove 19 extending in the X direction of the frame 11 and extends in the X direction parallel to a guide rail 38 while facing the guide rail 38. The second slider 137 is guided by the second guide rail 138 and moves in the X direction. Since a stator is disposed at the second guide rail 138 and a mover is disposed at the second slider 137, the second guide rail 138 and the second slider 137 constitute a second X direction linear motor 139 that drives the second main body 131 in the X direction. As illustrated in FIG. 10, the second main body 131 fixed to the second slider 137 and moving together with the second slider 137 in the X direction parallel to a main body 31 is disposed to face the main body 31.

As illustrated in FIGS. 10 and 11, the second rotating shaft 132 attached to the second main body 131 extends in a direction parallel to a rotating shaft 32, the second mounting arm 133 extending obliquely downward in the Z direction from a second central line 135 is attached to a distal end of the second rotating shaft 132, and the second flip head 140 is fixed to the distal end of the second mounting arm 133 with a second bolt 134. As illustrated in FIG. 10, the second mounting arm 133 extends also in a direction parallel to a mounting arm 33. Further, the second stepping motor 136 serving as a second inversion drive mechanism that rotates the second rotating shaft 132 to invert the second flip head 140 is disposed inside the second main body 131.

As illustrated in FIG. 11, the second flip head 140 includes a second base 141, and two second pickup nozzles 142 attached to a second lower surface 141b on a lower side of the second base 141 in the Z direction. The second base 141 is a plate-shaped member fixed to the distal end of the second mounting arm 133 with a second bolt 134, and the two second pickup nozzles 142 are fixed to the second lower surface 141b of the second base 141 to be linearly aligned at the pitch P2 in the X direction with respect to a central line 149 of the second flip head 140 in the Z direction. The pitch P2 of the two second pickup nozzles 142 is the same as the pitch P1 of the two second mounting nozzles 126, and is also the same as a pitch P1 of the two mounting nozzles 26.

In FIGS. 10 and 11, a flip head 40 and the second flip head 140 illustrated by a solid line illustrate a case in which pickup nozzles 42 and the second pickup nozzles 142 face downward (a state in which an upper surface 41a of the base 41 and a second upper surface 141a of the second base 141 can be seen), and the flip head 40 and the second flip head 140 illustrated by a dashed-dotted line illustrate a case in which the flip head 40 and the second flip head 140 are inverted, and thereby a lower surface 41b and the second lower surface 141b face upward in the Z direction, and the pickup nozzles 42 and the second pickup nozzles 142 also face upward.

In FIG. 10, a dashed-dotted line 47 illustrates a direction in which the pickup nozzles 42 and the second pickup nozzles 142 are aligned when the pickup nozzles 42 and the second pickup nozzles 142 face downward. As illustrated in FIG. 10, arrangement directions of the pickup nozzles 42 and the second pickup nozzles 142 (a direction in which the dashed-dotted line 47 extends) are respectively inclined by 45° in the X axis direction from a central line 35 of the rotating shaft 32 (a direction in which the rotating shaft 32 extends) and the second central line 135 of the second rotating shaft 132 (a direction in which the second rotating shaft 132 extends). When the main body 31 and the second main body 131 are moved in the X direction by the X direction linear motor 39 and the second X direction linear motor 139, the pickup nozzles 42 and the second pickup nozzles 142 of the flip head 40 and the second flip head 140 move in the X direction on the dashed-dotted line 47. Further, since the direction in which the dashed-dotted line 47 extends is the X direction and the main body 31 and the second main body 131 move in the X direction, the extending directions of the rotating shaft 32 and the second rotating shaft 132 are also inclined by 45° with respect to the movement direction of the main body 31 and the second main body 131.

As illustrated in FIGS. 9 and 11, since the second mounting arm 133 also extends obliquely downward in the Z direction from the second central line 135 of the second rotating shaft 132, and the second base 141 is fixed to the distal end thereof with the second bolt 134, the second upper surface 141a of the second base 141 is at a position lower than a center (the second central line 135) of the second rotating shaft 132 by a height H1 when the second pickup nozzles 142 face downward.

As illustrated in FIG. 11, each of the second pickup nozzles 142 includes a second casing 143 having a columnar shape and a hole extending in a longitudinal direction at a center thereof, and a second pickup tool 144 moving through the hole that is provided in the second casing 143 in a longitudinal direction. A second electromagnetic coil 145 is provided in the second casing 143, and an extension amount of the second pickup tool 144 from an end surface of the second casing 143 can be adjusted by energizing the second electromagnetic coil 145. Further, the second pickup tool 144 has a vacuum hole provided at a center thereof, and the semiconductor chip 18 can be vacuum-adsorbed to a distal end surface thereof.

As illustrated by the solid line in FIGS. 10 and 11, when the second rotating shaft 132 is rotated by 180° by the second stepping motor 136 from a state in which the second pickup tool 144 faces downward, the second base 141 connected to the second rotating shaft 132 is rotated around the second rotating shaft 132 by 180°, resulting in inversion such as the second upper surface 141a becoming a lower side in the Z direction and the second lower surface 141b becoming an upper side in the Z direction. As a result, the second pickup tool 144 also is in a state of facing upward in the Z direction as illustrated by the dashed-dotted line in FIGS. 10 and 11. When the second base 141 is inverted, contrary to what has been described above, an alignment direction of the second pickup nozzles 142 is a direction illustrated by a dashed-dotted line 48 in a direction inclined by 45° in a Y axis direction from the second central line 135 (a direction in which the second rotating shaft 132 extends) of the second rotating shaft 132. In this way, when the second rotating shaft 132 rotates by 180° to invert the second base 141, an alignment direction of the second pickup tools 144 is rotated by 90° from the X direction in the Y direction.

Further, as illustrated in FIGS. 9 and 11, when the second base 141 is inverted as in the case in which the base 41 is inverted, the second upper surface 141a of the second base 141 to which the second mounting arm 133 is fixed is at a position higher than the second central line 135 of the second rotating shaft 132 by a height H1. Therefore, in a state in which the flip head 40 is inverted and the upper surface 41a of the base 41 becomes higher than the central line 35 of the rotating shaft 32 by the height H1 as illustrated by a broken line in FIG. 9, and the second flip head 140 is not inverted and the second pickup nozzles 142 face downward as illustrated by a solid line in FIG. 9, the flip head 40, the mounting arm 33, the rotating shaft 32, and the main body 31 are spaced apart from the second flip head 140, the second mounting arm 133, the second rotating shaft 132, and the second main body 131 in a vertical direction (Z direction) and do not interfere with each other. Therefore, the electronic component handling unit 30 and the second electronic component handling unit 130 can move in the X direction passing by each other when either the electronic component handling unit 30 or the second electronic component handling unit 130 is caused to be at an inverted position.

Also, as in the electronic component handling unit 30 described above with reference to FIG. 2, as illustrated in FIG. 9, a distance between the second pickup tool 144 and the second mounting tool 123 becomes short when the second flip head 140 is inverted, and the extension amount of the second pickup tool 144, to be described below, when delivering the semiconductor chip 18 from the second pickup tool 144 to the second mounting tool 123 can be decreased.

A second motor 121, the second stepping motor 136, the second X direction drive motor, the second Y direction drive motor, and the like of the flip-chip bonding apparatus 200 configured as described above are all controlled by the control unit 60. The control unit 60 is a computer in which a central processing unit (CPU) performing arithmetic processing and a storage unit storing operation programs and operation data are included. Hereinafter, an operation of the flip-chip bonding apparatus 200 will be described with reference to FIGS. 5 to 7 and FIG. 12.

Figure 12:
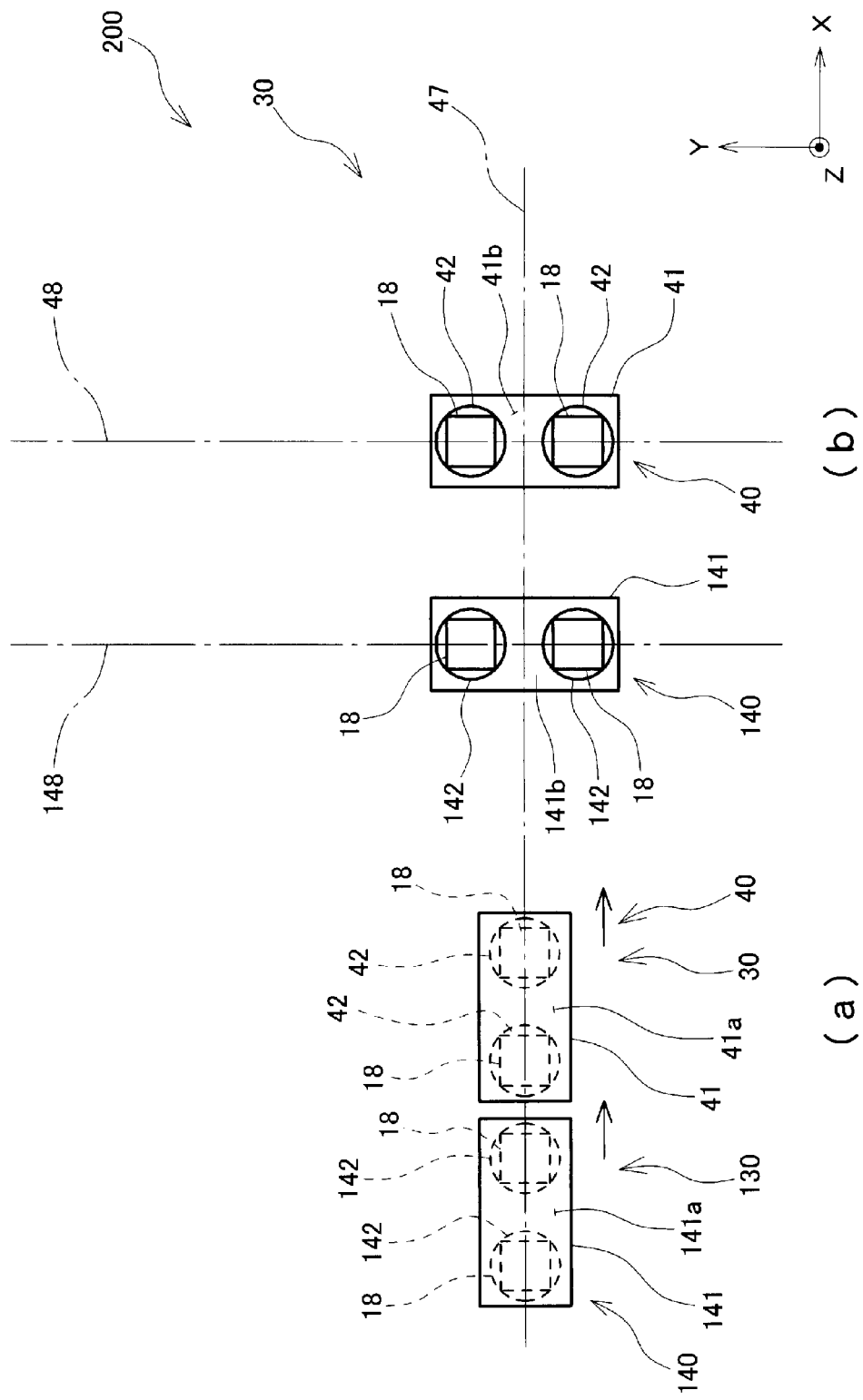
FIG. 12 is an explanatory view illustrating an operation of inverting a semiconductor chip by the flip-chip bonding apparatus of another embodiment of the present invention.

In the same process as described above with reference to (a) to (c) of FIG. 5, the control unit 60 picks up two semiconductor chips 18 with the two pickup nozzles 42, and picks up two semiconductor chips 18 with the two second pickup nozzles 142. When four semiconductor chips 18 are picked up in total by picking up two semiconductor chips 18 in each of the pickup nozzles 42 and the second pickup nozzles 142, the control unit 60 moves the electronic component handling unit 30 and the second electronic component handling unit 130 in the X direction by the X direction linear motor 39 and the second X direction linear motor 139 illustrated in FIG. 10. Accordingly, as illustrated in FIG. 12(*a*), the two pickup nozzles 42 and the two second pickup nozzles 142 to which the semiconductor chips 18 are vacuum-adsorbed also move in the X direction. At this time, the two pickup nozzles 42 of the flip head 40 and the two second pickup nozzles 142 of the second flip head 140 move in the X direction on the dashed-dotted line 47 as described with reference to FIG. 10.

When the flip head 40 is moved to a position to be inverted, the control unit 60 inverts the flip head 40. Then, as described above with reference to FIGS. 10 and 11, the base 41 is inverted and the two pickup nozzles 42 are turned upward. Further, as illustrated in FIG. 12(*b*), the alignment direction of the two pickup nozzles 42 is in the Y direction rotated by 90° from the X direction before the inversion. The dashed-dotted line 48 in FIG. 12(*b*) is a line illustrating the alignment direction of the two pickup nozzles 42 after the flip head 40 is inverted, and is also a line along which a center of the two mounting tools 23 moves in the Y direction when the two mounting tools 23 move in the Y direction. Similarly, when the second flip head 140 is moved to a position to be inverted, the control unit 60 inverts the second flip head 140. Then, the second base 141 is inverted and the two second pickup nozzles 142 are turned upward, and simultaneously the alignment direction of the two second pickup nozzles 142 is in the Y direction rotated by 90° from the X direction before the inversion. The dashed-dotted line 148 in FIG. 12(*b*) is a line illustrating the alignment direction of the two second pickup nozzles 142 after the second flip head 140 is inverted, and is also a line along which a center of the two second mounting tools 123 moves in the Y direction when the two second mounting tools 123 move in the Y direction.

When the flip head 40 and the second flip head 140 are inverted as illustrated by the broken line in FIG. 9, the control unit 60 operates the Y direction drive motor and the second Y direction drive motor so that the mounting head 20 and the second mounting head 120 are moved to right above the inverted flip head 40 and the second flip head 140 as illustrated in FIG. 9. At this time, centers of the two mounting tools 23 move in the Y direction along the dashed-dotted line 48 illustrated in FIG. 12, and centers of the two second mounting tools 123 move in the Y direction along the dashed-dotted line 148 illustrated in FIG. 12. As described above, since the pitch P1 of the two mounting nozzles 26 is the same as the pitch P2 of the two pickup nozzles 42, and the pitch P1 of the two second mounting nozzles 126 is the same as the pitch P2 of the two second pickup nozzles 142, when the mounting head 20 and the second mounting head 120 come to right above the pickup nozzles 42 and the second pickup nozzles 142 that have been inverted, center positions of the two mounting tools 23 and center positions of the two pickup tools 44, and center positions of the two second mounting tools 123 and center positions of the two second pickup tools 144 are respectively coincident with each other.

As described above with reference to (b) of FIG. 7, the control unit 60 energizes the electromagnetic coils 45 and the second electromagnetic coils 145 of the pickup nozzles 42 and the second pickup nozzles 142 to extend the distal end surfaces of the pickup tools 44 and the second pickup tools 144, and then the semiconductor chips 18 adsorbed to the distal end surfaces of the pickup tools 44 and the second pickup tools 144 are brought into close proximity with surfaces of the mounting tools 23 and the second mounting tools 123. Then, the control unit 60 releases a vacuum state of the vacuum suction holes of the pickup tools 44 and the second pickup tools 144, and makes the vacuum holes of the mounting tools 23 and the second mounting tools 23 into a vacuum state. Then, the semiconductor chips 18 are separated from the distal end surfaces of the pickup tools 44 and the second pickup tools 144, and are vacuum-adsorbed to the surfaces of the mounting tools 23 and the second mounting tools 123. In this manner, the semiconductor chips 18 are delivered from the two pickup tools 44 to the two mounting tools 23.

When the semiconductor chips 18 are delivered from the two pickup tools 44 and the two second pickup tools 144 to the two mounting tools 23 and the two second mounting tools 123, the control unit 60 returns the flip head 40 and the second flip head 140 to an original state (non-inverted state).

When the mounting tools 23 and the second mounting tools 123 have received the semiconductor chips 18, as described above with reference to (c) of FIG. 7, the control unit 60 moves the mounting head 20 and the second mounting head 120 to above the circuit board 17 by the Y direction drive motor (not illustrated). Then, the semiconductor chips 18 that have been vacuum-adsorbed to the mounting tools 23 and the second mounting tools 123 are heated using the pulse heaters 25 and the second pulse heaters 125 of the mounting nozzles 26 and the second mounting nozzles 126, the motors 21 and the second motors 121 are rotated to lower the mounting tools 23 and the second mounting tools 123 together with the base portions 22 and the second base portions 122 onto the circuit board 17, and the semiconductor chips 18 are thereto-compression bonded onto the circuit board 17 by the mounting tools 23 and the second mounting tools 123. The thermo-compression bonding of the semiconductor chips 18 may be performed one at a time in sequence, may be performed two at a time simultaneously by making a set of the mounting tool 23 and the second mounting tool 123, or four semiconductor chips 18 may simultaneously be thermo-compression bonded onto the circuit board 17.

As described above, the electronic component handling unit 30 and the second electronic component handling unit 130 of the flip-chip bonding apparatus 200 of the present embodiment move in the X direction perpendicular to a direction in which the mounting nozzles 26 and the second mounting nozzles 126 are aligned (Y direction) to pick up the plurality of semiconductor chips 18 to be aligned in the X direction, invert the plurality of semiconductor chips 18 and simultaneously change the alignment direction of the semiconductor chips 18 in the Y direction that is a direction in which the mounting nozzles 26 and the second mounting nozzles 126 are aligned, and thereby a row of the plurality of picked up semiconductor chips 18 can be simultaneously delivered to the mounting tools 23 and the second mounting tools 123 at the distal ends of the mounting nozzles 26 and the second mounting nozzles 126, and thus the bonding can be speeded up.

Further, in the flip-chip bonding apparatus 200 of the present embodiment, since it is possible to employ such a device arrangement in which the alignment direction of the mounting nozzles 26 and the second mounting nozzles 126 (Y direction) are respectively perpendicular to the alignment direction of the pickup nozzles 42 and the second pickup nozzles 142 (X direction), the installation area can be decreased by disposing the wafer holder 50 on the lateral side in the X direction of the frame 11, for example.

Further, as illustrated in FIG. 10, the electronic component handling unit 30 and the second electronic component handling unit 130 of the present embodiment can move in the X direction passing by each other when either the flip head 40 or the second flip head 140 is caused to be at an inverted position. Therefore, when this passing-by function is used, for example, after the second electronic component handling unit 130 performs delivery of the semiconductor chips 18 while the electronic component handling unit 30 picks up the semiconductor chips 18, the electronic component handling unit 30 and the second electronic component handling unit 130 move in the X direction passing by each other, and then the second electronic component handling unit 130 can perform picking-up of the next semiconductor chips while the electronic component handling unit 30 performs delivery of the semiconductor chips 18.

Further, since the pitch P1 of the two mounting nozzles 26, the pitch P1 of the two second mounting nozzles 126, the pitch P2 of the two pickup nozzles 42 of the electronic component handling unit 30, and the pitch P2 of the two second pickup nozzles 142 mounted on the second electronic component handling unit 130 are all the same, the semiconductor chips 18 can be delivered to both of the two mounting tools 23 and the two second mounting tools 123 by the electronic component handling unit 30, and the semiconductor chips 18 can be delivered to both of the two mounting tools 23 and the two second mounting tools 123 also by the second electronic component handling unit 130.

As a result, since operations of picking up, inverting, delivering, and bonding the semiconductor chips 18 can be efficiently performed in combination, the flip-chip bonding apparatus 200 of the present embodiment can further increase the bonding speed as compared with that in the flip-chip bonding apparatus 100 of the embodiment described above with reference to FIGS. 1 to 7.

Next, referring to FIGS. 13 and 14, modified examples of the electronic component handling unit 30 and the second electronic component handling unit 130 mounted on the flip-chip bonding apparatus 200 described above with reference to FIGS. 8 to 12 will be described. The same reference signs are given to the portions described above with reference to FIGS. 8 to 12, and description thereof will be omitted.

Figure 13:
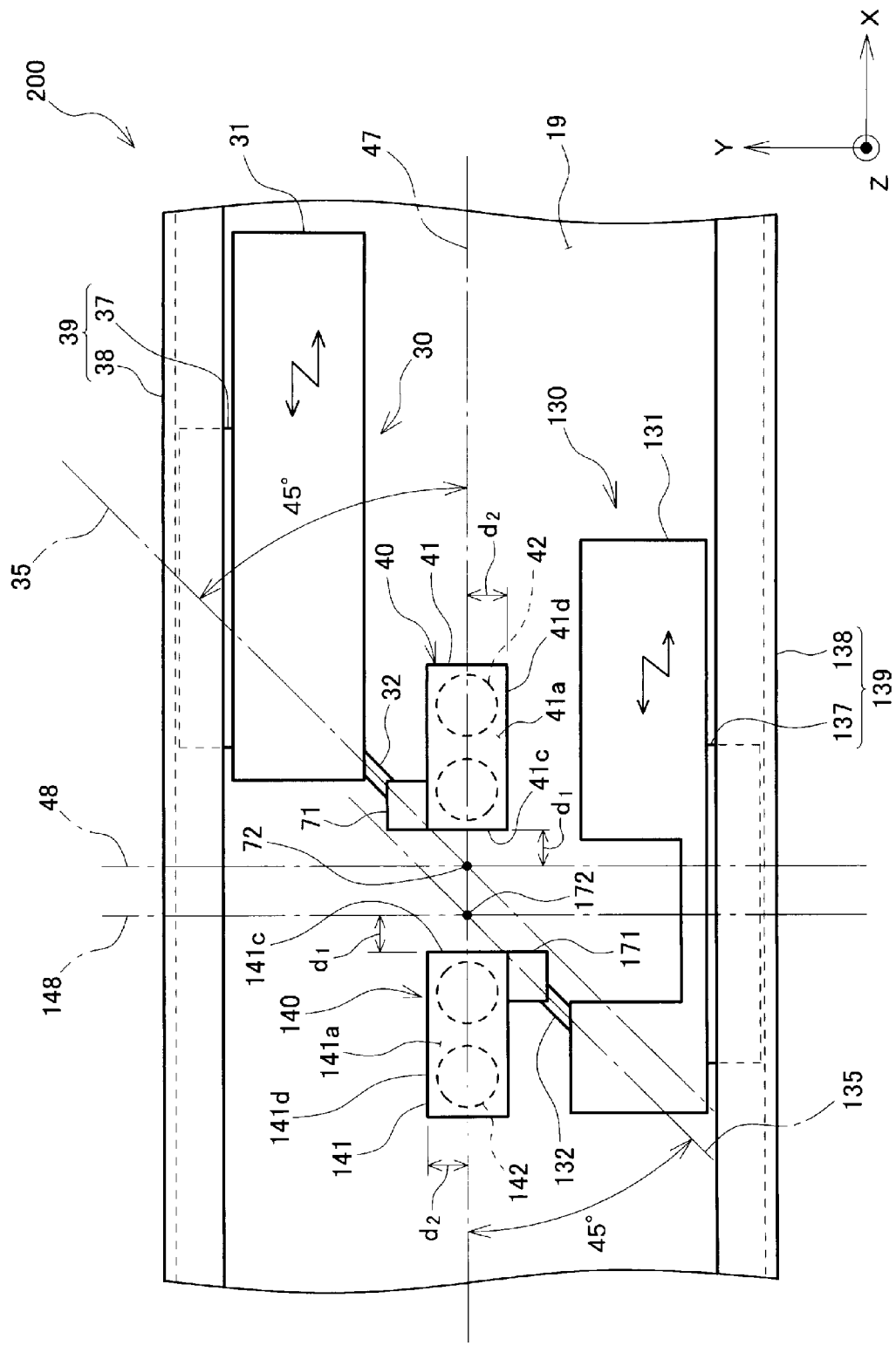
FIG. 13 is a plan view of another electronic component handling unit mounted on the flip-chip bonding apparatus of another embodiment of the present invention.

In the electronic component handling unit 30 and the second electronic component handling unit 130 illustrated in FIG. 13, the base 41 and the second base 141 of the flip head 40 and the second flip head 140 are attached to the distal ends of the rotating shaft 32 and the second rotating shaft 132 with an adapter 71 and a second adapter 171 interposed therebetween, respectively.

In the electronic component handling unit 30 illustrated in FIG. 13, a Y direction end surface 41d of the base 41 facing the second electronic component handling unit 130 protrudes by a distance d2 from the dashed-dotted line 47 toward the second electronic component handling unit 130 side due to the adapter 71. Further, an X direction end surface 41c of the base 41 is shifted from an intersection point 72 of the central line 35 of the rotating shaft 32 of the electronic component handling unit 30 and the dashed-dotted line 47 illustrating the alignment direction of the pickup nozzles 42 to a base side of the rotating shaft 32 along the dashed-dotted line 47 by a distance d1 that is larger than the distance d2 due to the adapter 71. That is, the flip head 40 is shifted by the distance d1 that is larger than the distance d2 from the intersection point 72 to the base side of the rotating shaft 32 along the dashed-dotted line 47.

Similarly, in the second electronic component handling unit 130 illustrated in FIG. 13, a Y direction end surface 141d of the second base 141 facing the electronic component handling unit 30 protrudes by the distance d2 from the dashed-dotted line 47 toward the electronic component handling unit 30 side due to a second adapter 171. Further, an X direction end surface 140c of the second base 141 is shifted from a second intersection point 172 of the second central line 135 of the second rotating shaft 132 of the second electronic component handling unit 130 and the dashed-dotted line 47 illustrating the alignment direction of the second pickup nozzles 142 to a base side of the second rotating shaft 132 along the dashed-dotted line 47 by the distance d1 that is larger than the distance d2 due to the second adapter 171. That is, the second flip head 140 is shifted by the distance d1 that is larger than the distance d2 from the second intersection point 172 to the base side of the rotating shaft 32 along the dashed-dotted line 47.

Figure 14:
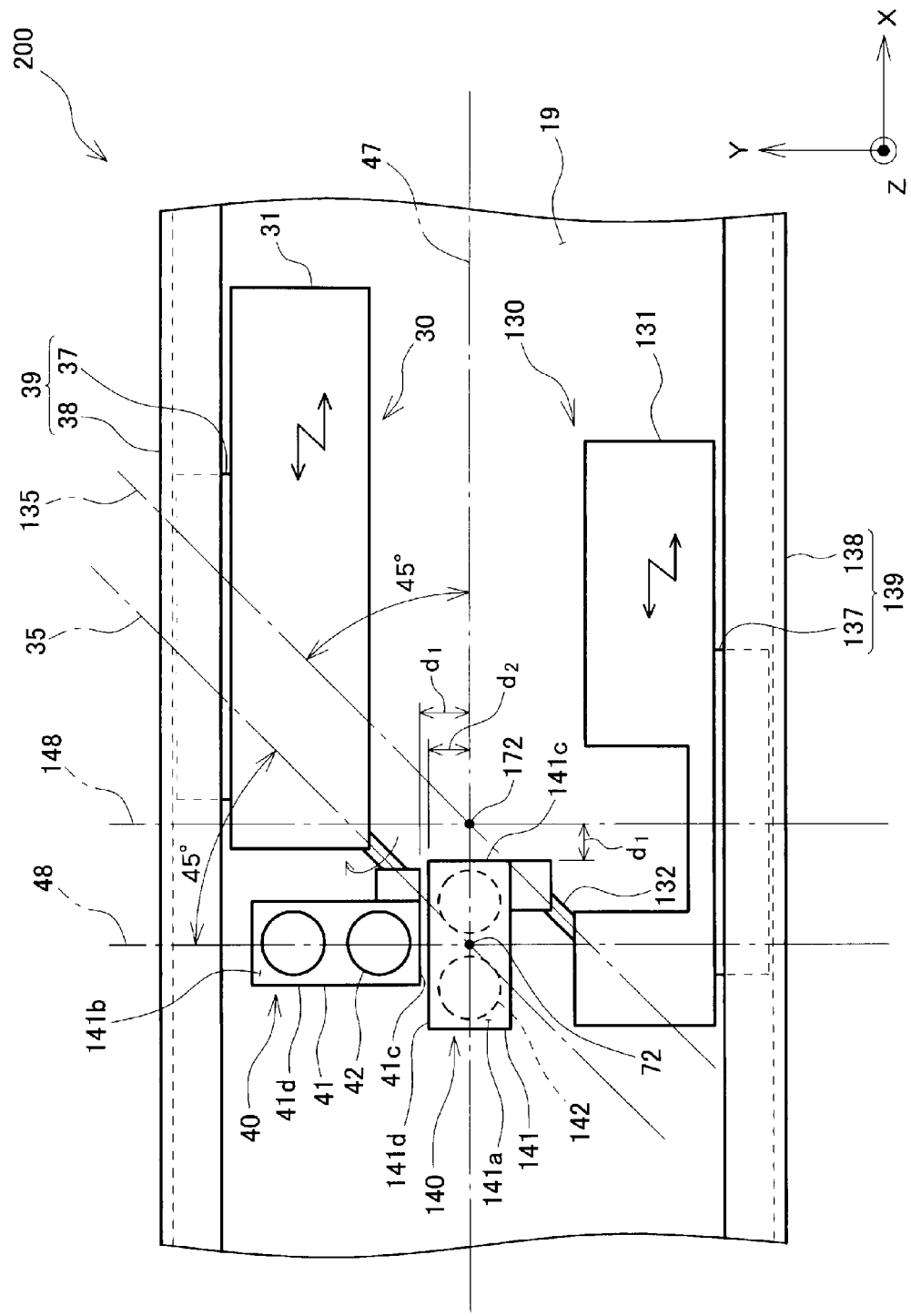
FIG. 14 is a plan view illustrating an operation of another electronic component handling unit mounted on the flip-chip bonding apparatus of another embodiment of the present invention.
Figure 15:
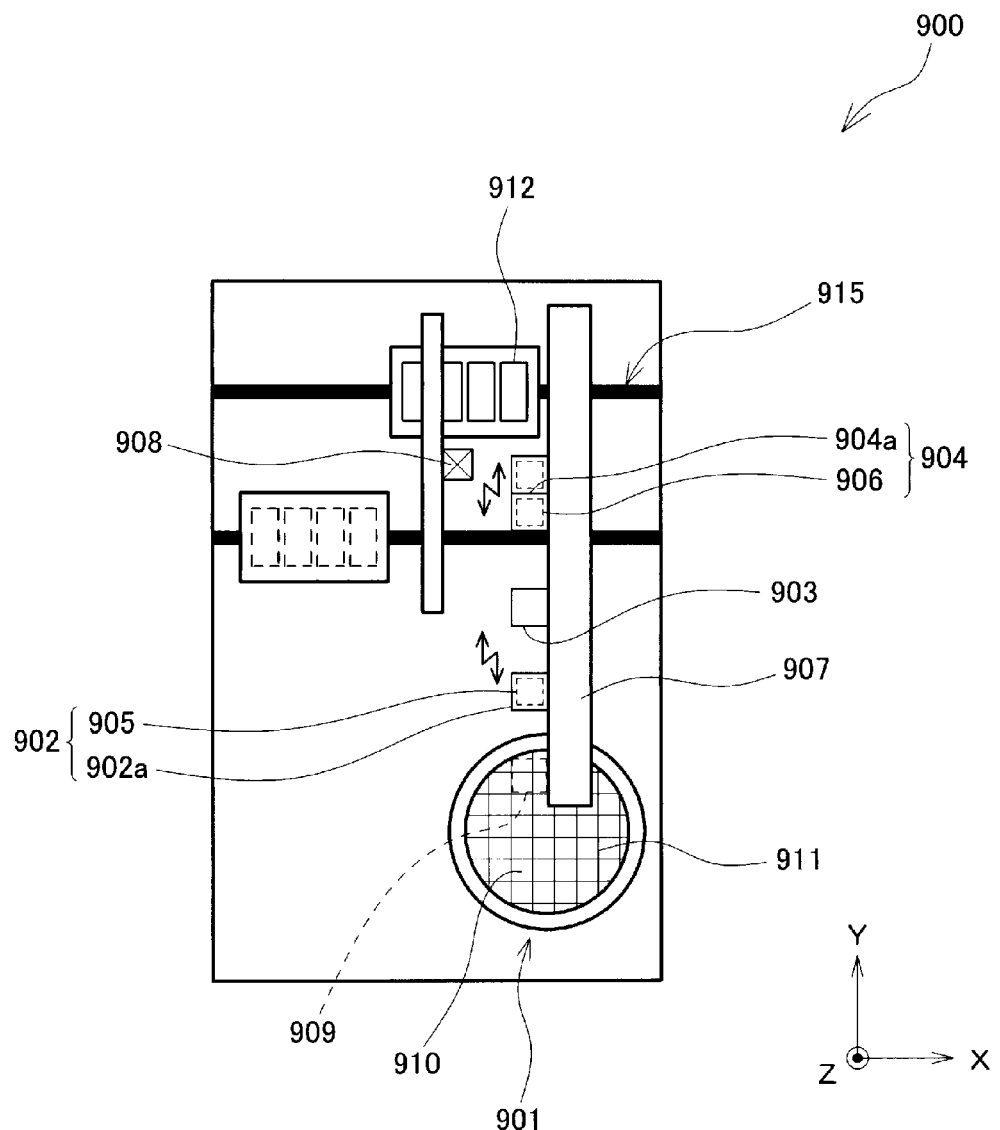
FIG. 15 is a plan view illustrating a flip-chip bonder according to a conventional technology.

In the electronic component handling unit 30 with such a configuration, when the flip head 40 is inverted as illustrated in FIG. 14, the X direction end surface 41c of the base 41 is rotated by 90° in a horizontal direction and becomes an end surface facing in the Y direction. The X direction end surface 41c facing in the Y direction is at a position separated by a distance d1 from the dashed-dotted line 47 to the main body 31 side. Since the second electronic component handling unit 130 is not inverted, a protrusion amount of the Y direction end surface 141d of the second base 141 from the dashed-dotted line 47 toward the electronic component handling unit 30 side is the distance d2 that is smaller than the distance d1. Therefore, as illustrated in FIG. 14, when the flip head 40 of the electronic component handling unit 30 is inverted and the second flip head 140 of the second electronic component handling unit 130 is not inverted, a gap of (d1-d2) can be formed between the X direction end surface 41c of the base 41 rotated in the Y direction and the Y direction end surface 141d of the second base 141. Therefore, the electronic component handling unit 30 and the second electronic component handling unit 130 can move in the X direction passing by each other. In contrast, when the second flip head 140 of the second electronic component handling unit 130 is inverted and the flip head 40 of the electronic component handling unit 30 is not inverted, the gap of (d1-d2) can be formed between the X direction end surface 141c of the second base 141 rotated in the Y direction and the Y direction end surface 41d of the base 41, and thus the electronic component handling unit 30 and the second electronic component handling unit 130 can move in the X direction passing by each other.

Also when the modified examples of the electronic component handling unit 30 and the second electronic component handling unit 130 described above are applied to the flip-chip bonding apparatus 200 described above, the flip-chip bonding apparatus 200 described with reference to FIGS. 8 to 12 is operable therewith, and the bonding speed can be further increased as compared with that in the flip-chip bonding apparatus 100 of the embodiment described above with reference to FIGS. 1 to 7.

In each of the embodiments described above, it has been described that two pickup nozzles 42 and two second pickup nozzles 142 are respectively attached to the flip head 40 and the second flip head 140, however, three or more pickup nozzles 42 and second pickup nozzles 142 may be attached to the flip head 40 and the second flip head 140 as long as they are linearly arranged. Similarly, the mounting nozzle 26 and the second mounting nozzle 126 disposed in the mounting head 20 and the second mounting head 120 may also be three or more instead of two as long as they are arranged in parallel. Further, the number of pickup nozzles 42 and second pickup nozzles 142 arranged may be greater than the number of mounting nozzles 26 and second mounting nozzles 126 arranged.

The present invention is not limited to the embodiments described above, and includes all changes and modifications without departing from the technical scope and spirit of the present invention as defined by the scope of the claims.

REFERENCE SIGNS LIST

11 Frame
12 Guide rail
13, 113 Gantry frame
14, 114 Slider
15 Mounting stage
16 Conveying rail
17, 912 Circuit board
18, 910 Semiconductor chip
19 Groove
20, 120 Mounting head
21, 121 Motor
22, 122 Base portion
23, 123 Mounting tool
24, 124 Ball screw
25, 125 Pulse heater
26, 126 Mounting nozzle
30, 130 Electronic component handling unit
31, 131 Main body
32, 132 Rotating shaft
33, 133 Mounting arm
34, 134 Bolt
35, 49, 135 Central line
36, 136 Stepping motor
37, 137 Slider
38, 138 Guide rail
39, 139 X direction linear motor
40, 140 Flip head
41, 141 Base
42, 142 Pickup nozzle
43, 143 Casing
44, 144, 905 Pickup tool
45, 145 Electromagnetic coil
47, 48, 148 Dashed-dotted line
50 Wafer holder
51, 911 Wafer
52 Dicing sheet
55, 909 Push-up unit
60 Control unit
71, 171 Adapter
72, 172 Intersection point
100, 200, 900 Flip-chip bonding apparatus
901 Chip supply unit
902 Pickup unit
902*a* Pickup head
903 Inversion mechanism
904 Bonding unit
904*a* Bonding head
906 Bonding tool
907 Y direction drive mechanism
908 Camera
915 Conveying unit

The invention claimed is:

1. An electronic component mounting apparatus that mounts electronic components on a substrate or other electronic components, the electronic component mounting apparatus comprising:
a mounting head including a plurality of mounting nozzles that vertically move a plurality of mounting tools to which the electronic components are adsorbed, aligned in a Y direction and attached thereto and configured to move in the Y direction; and
an electronic component handling unit moving in an X direction perpendicular to the Y direction to pick up the plurality of electronic components to be aligned in the X direction and configured to invert the plurality of electronic components and simultaneously change an alignment direction of the plurality of electronic components from the X direction in the Y direction,
wherein the electronic component handling unit includes:
a main body linearly moving in the X direction;
a rotating shaft attached to the main body to be inclined by about 45° with respect to the X direction in which the main body moves;
a flip head attached to the rotating shaft and in which a plurality of pickup nozzles that adsorb and hold the electronic components are disposed in a straight line; and
an inversion drive mechanism attached to the main body and configured to rotate the rotating shaft to invert the flip head, and
the plurality of pickup nozzles are arranged to be inclined by about 45° with respect to a direction in which the rotating shaft extends.

2. The electronic component mounting apparatus according to claim 1, wherein an arrangement pitch of the plurality of mounting tools is the same as an arrangement pitch of the plurality of pickup nozzles.

3. The electronic component mounting apparatus according to claim 1, wherein:
the flip head includes a base connected to the rotating shaft;
the rotating shaft is connected to an upper surface of the base and the pickup nozzles are attached to a lower surface of the base; and
the upper surface of the base deviates from a central line of the rotating shaft in a direction of a distal end of the pickup nozzle.

4. The electronic component mounting apparatus according to claim 3, comprising:
a wafer holder that holds a diced wafer; and
a push-up unit disposed on a lower side of the wafer holder and configured to push up the wafer, wherein
the wafer holder moves only in the Y direction, and
the push-up unit moves only in the X direction.

5. The electronic component mounting apparatus according to claim 1, comprising:
a wafer holder that holds a diced wafer; and
a push-up unit disposed on a lower side of the wafer holder and configured to push up the wafer, wherein
the wafer holder moves only in the Y direction, and
the push-up unit moves only in the X direction.

6. An electronic component mounting apparatus that mounts electronic components on a substrate or other electronic components, the electronic component mounting apparatus comprising:
a first mounting head including a plurality of first mounting nozzles that vertically move a plurality of first mounting tools to which the electronic components are adsorbed, aligned in a Y direction and attached thereto and configured to move in the Y direction;
a first electronic component handling unit moving in an X direction perpendicular to the Y direction to pick up the plurality of electronic components to be aligned in the X direction and configured to invert the plurality of electronic components and simultaneously change an alignment direction of the plurality of electronic components from the X direction in the Y direction;
a second mounting head including a plurality of second mounting nozzles that vertically move a plurality of second mounting tools to which the electronic components are adsorbed, aligned in the Y direction and attached thereto and disposed parallel to the first mounting head; and
a second electronic component handling unit disposed parallel to and facing the first electronic component handling unit, moving parallel to the first electronic component handling unit to pick up the plurality of electronic components to be aligned in the X direction, and configured to invert the plurality of electronic components and simultaneously change an alignment direction of the plurality of electronic components from the X direction in the Y direction,
wherein the first electronic component handling unit includes:
a first main body linearly moving in the X direction;
a first rotating shaft attached to the first main body to be inclined by about 45° with respect to a direction in which the first main body moves;
a first flip head attached to the first rotating shaft and in which a plurality of first pickup nozzles that adsorb and hold the electronic components are disposed in a straight line; and
a first inversion drive mechanism attached to the first main body and configured to rotate the first rotating shaft to invert the first flip head,
the first pickup nozzles are arranged to be inclined by about 45° with respect to a direction in which the first rotating shaft extends,
the second electronic component handling unit includes:
a second main body disposed to face the first main body and configured to linearly move parallel to the first main body;
a second rotating shaft attached to the second main body and configured to extend in a direction parallel to the first rotating shaft;
a second flip head attached to the second rotating shaft and in which a plurality of second pickup nozzles that adsorb and hold the electronic components are disposed in a straight line; and
a second inversion drive mechanism attached to the second main body and configured to rotate the second rotating shaft to invert the second flip head, and
the second pickup nozzles are arranged to be inclined by about 45° with respect to a direction in which the second rotating shaft extends.

7. The electronic component mounting apparatus according to claim 6, wherein:
an arrangement pitch of the plurality of first mounting tools is the same as an arrangement pitch of the plurality of first pickup nozzles or the plurality of second pickup nozzles; and
an arrangement pitch of the plurality of second mounting tools is the same as the arrangement pitch of the plurality of first pickup nozzles or the plurality of second pickup nozzles.

8. The electronic component mounting apparatus according to claim 6, wherein:
in a state in which the first flip head and the second flip head are not inverted, the first flip head and the second flip head are movable on one straight line parallel to a movement direction of the first main body and the second main body;
in a state in which the first flip head of the first electronic component handling unit is inverted, the first electronic component handling unit is able to pass by the second electronic component handling unit in which the second flip head is not inverted in a movement direction; and
in a state in which the second flip head of the second electronic component handling unit is inverted, the second electronic component handling unit is able to pass by the first electronic component handling unit in which the first flip head is not inverted in a movement direction.

9. The electronic component mounting apparatus according to claim 8, wherein:
the first flip head includes a first base connected to the first rotating shaft;
the second flip head includes a second base connected to the second rotating shaft;
the first rotating shaft is connected to a first upper surface of the first base and the first pickup nozzles are attached to a first lower surface of the first base;
the second rotating shaft is connected to a second upper surface of the second base and the second pickup nozzles are attached to a second lower surface of the second base;
the first upper surface of the first base deviates from a first central line of the first rotating shaft in a direction of a distal end of the first pickup nozzle; and
the second upper surface of the second base deviates from a second central line of the second rotating shaft in a direction of a distal end of the second pickup nozzle.

10. The electronic component mounting apparatus according to claim 9, comprising:
a wafer holder that holds a diced wafer; and
a push-up unit disposed on a lower side of the wafer holder and configured to push up the wafer, wherein
the wafer holder moves only in the Y direction, and
the push-up unit moves only in the X direction.

11. The electronic component mounting apparatus according to claim 8, wherein:
the first flip head is shifted from an intersection point of the first central line of the first rotating shaft and the one straight line to a base side of the first rotating shaft along the one straight line and is attached to the first rotating shaft;
the second flip head is shifted from an intersection point of the second central line of the second rotating shaft and the one straight line to a base side of the second rotating shaft along the one straight line and is attached to the second rotating shaft;
a shift amount of the first flip head is larger than an amount of a protrusion of the second flip head from the one straight line to the first main body side when the second flip head is not inverted; and a shift amount of the second flip head is larger than an amount of a protrusion of the first flip head from the one straight line to the second main body side when the first flip head is not inverted.

12. The electronic component mounting apparatus according to claim 11, comprising:

a wafer holder that holds a diced wafer; and a push-up unit disposed on a lower side of the wafer holder and configured to push up the wafer, wherein the wafer holder moves only in the Y direction, and the push-up unit moves only in the X direction.

13. The electronic component mounting apparatus according to claim 8, comprising:

a wafer holder that holds a diced wafer; and a push-up unit disposed on a lower side of the wafer holder and configured to push up the wafer, wherein the wafer holder moves only in the Y direction, and the push-up unit moves only in the X direction.

14. The electronic component mounting apparatus according to claim 6, comprising:

a wafer holder that holds a diced wafer; and a push-up unit disposed on a lower side of the wafer holder and configured to push up the wafer, wherein the wafer holder moves only in the Y direction, and the push-up unit moves only in the X direction.

\* \* \* \* \*